(12) United States Patent
Lowes

(10) Patent No.: US 10,546,846 B2
(45) Date of Patent: Jan. 28, 2020

(54) LIGHT TRANSMISSION CONTROL FOR MASKING APPEARANCE OF SOLID STATE LIGHT SOURCES

(75) Inventor: Theodore Douglas Lowes, Lompoc, CA (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 12/842,639

(22) Filed: Jul. 23, 2010

(65) Prior Publication Data
US 2012/0018754 A1    Jan. 26, 2012

(51) Int. Cl.
*H01L 25/16*     (2006.01)
*F21V 3/12*      (2018.01)

(52) U.S. Cl.
CPC ............ *H01L 25/167* (2013.01); *F21V 3/12* (2018.02)

(58) Field of Classification Search
CPC ........... F21K 9/135; F21V 3/12; H01L 25/167
USPC ............ 257/98, 100, 99, E33.058, E33.059, 257/E33.061, E33.067
See application file for complete search history.

(56) References Cited

U.S. PATENT DOCUMENTS

| | | |
|---|---|---|
| 3,780,357 A | 12/1973 | Haitz |
| 4,273,422 A | 6/1981 | Saxe ........................... 999/362 |
| 4,576,796 A | 3/1986 | McCormick |
| 4,733,335 A | 3/1988 | Serizawa et al. ............. 362/503 |
| 4,918,497 A | 4/1990 | Edmond ......................... 357/17 |
| 4,935,665 A | 6/1990 | Murata ......................... 313/500 |
| 4,946,547 A | 8/1990 | Palmour et al. .............. 156/643 |
| 4,966,862 A | 10/1990 | Edmond ....................... 437/100 |
| 5,027,168 A | 6/1991 | Edmond ......................... 357/17 |
| 5,200,022 A | 4/1993 | Kong et al. ................... 156/612 |

(Continued)

FOREIGN PATENT DOCUMENTS

| | | |
|---|---|---|
| CN | 2310925 | 3/1999 |
| CN | 2310925 Y | 3/1999 |

(Continued)

OTHER PUBLICATIONS

Patent Abstracts of Japan 2004-221185, Aug. 5, 2004.
(Continued)

*Primary Examiner* — Vongsavanh Sengdara

(57) ABSTRACT

A light emitter device, package, or lamp that comprises and light emitter and a light transmission control material to mask the appearance of at least the light emitter. In one embodiment, a light emitting diode (LED) based lamp is disclosed, comprising an LED light source. A phosphor is arranged remote to the light source such that light emitted from the light source passes through this phosphor and is converted by this phosphor. A light transmission control material is applied at least partially outside the LED light source and the phosphor to reversibly mask the appearance of the LED light source and the phosphor. The light transmission control material is less masking when the LED light source is active. A method for masking the appearance of inactive light emitters is also disclosed that comprising providing at least one light emitter. Each of the at least one light emitters is provided with a light transmission control material over the light emitters to reversibly mask the appearance of the light emitters while the light emitters are inactive. The light transmission control material is less masking when the LED light source is active.

36 Claims, 5 Drawing Sheets

(56) References Cited

U.S. PATENT DOCUMENTS

| | | | | |
|---|---|---|---|---|
| 5,210,051 | A | 5/1993 | Carter, Jr. | 437/107 |
| 5,277,840 | A | 1/1994 | Osaka et al. | 252/301 |
| 5,338,944 | A | 8/1994 | Edmond et al. | 257/76 |
| RE34,861 | E | 2/1995 | Davis et al. | 437/100 |
| 5,393,993 | A | 2/1995 | Edmond et al. | 257/77 |
| 5,416,342 | A | 5/1995 | Edmond et al. | 257/76 |
| 5,523,589 | A | 6/1996 | Edmond et al. | 257/77 |
| 5,604,135 | A | 2/1997 | Edmond et al. | 437/22 |
| 5,614,131 | A | 3/1997 | Mukerji et al. | 264/1.9 |
| 5,631,190 | A | 5/1997 | Negley | 438/33 |
| 5,739,554 | A | 4/1998 | Edmond et al. | 257/103 |
| 5,766,987 | A | 6/1998 | Mitchell et al. | 438/126 |
| 5,813,753 | A | 9/1998 | Vriens et al. | |
| 5,849,354 | A | 12/1998 | Tsuchiyama | 427/73 |
| 5,858,278 | A | 1/1999 | Itoh et al. | 252/301 |
| 5,912,477 | A | 6/1999 | Negley | 257/95 |
| 5,923,053 | A | 7/1999 | Jakowetz et al. | 257/95 |
| 5,959,316 | A | 9/1999 | Lowery | |
| 5,988,925 | A | 12/1999 | Shimizu | 313/503 |
| 6,001,671 | A | 12/1999 | Fjelstad | 438/112 |
| 6,056,421 | A | 5/2000 | Johnson et al. | |
| 6,066,861 | A | 5/2000 | Hohn et al. | |
| 6,069,440 | A | 5/2000 | Shimizu et al. | 313/486 |
| 6,087,202 | A | 7/2000 | Exposito et al. | 438/113 |
| 6,120,600 | A | 9/2000 | Edmond et al. | 117/89 |
| 6,132,072 | A | 10/2000 | Turnbull et al. | 362/494 |
| 6,139,304 | A | 10/2000 | Centofante | 425/121 |
| 6,153,448 | A | 11/2000 | Takahashi et al. | |
| 6,157,086 | A | 12/2000 | Weber | 257/788 |
| 6,187,606 | B1 | 2/2001 | Edmond et al. | 438/46 |
| 6,201,262 | B1 | 3/2001 | Edmond et al. | 257/77 |
| 6,252,254 | B1 | 6/2001 | Soules et al. | 257/89 |
| 6,257,737 | B1 | 7/2001 | Marshall et al. | |
| 6,274,890 | B1 | 8/2001 | Oshio et al. | |
| 6,329,224 | B1 | 12/2001 | Nguyen et al. | 438/127 |
| 6,331,063 | B1 | 12/2001 | Kamada et al. | 362/373 |
| 6,333,522 | B1 | 12/2001 | Inoue et al. | 257/99 |
| 6,338,813 | B1 | 1/2002 | Hsu et al. | 264/272.14 |
| 6,350,041 | B1 | 2/2002 | Tarsa et al. | 362/231 |
| 6,362,303 | B1 | 3/2002 | Byker et al. | 428/423.1 |
| 6,366,018 | B1 | 4/2002 | Zalmanovich | |
| 6,376,277 | B2 | 4/2002 | Corisis | 438/106 |
| 6,404,125 | B1 | 6/2002 | Garbuzou | 313/499 |
| 6,416,827 | B1 | 7/2002 | Chakrapani | 428/1.31 |
| 6,468,832 | B1 | 10/2002 | Mostafazedeh | 438/112 |
| 6,501,100 | B1 | 12/2002 | Srivastava | |
| 6,504,180 | B1 | 1/2003 | Heremans et al. | |
| 6,522,065 | B1 | 2/2003 | Srivastava | |
| 6,531,328 | B1 | 3/2003 | Chen | 438/26 |
| 6,580,097 | B1 | 6/2003 | Soules et al. | |
| 6,583,444 | B2 | 6/2003 | Fjelstad | 257/82 |
| 6,624,058 | B1 | 9/2003 | Kazama | 438/612 |
| 6,642,652 | B2 | 11/2003 | Collins, III | 313/512 |
| 6,650,044 | B1 | 11/2003 | Lowery | 313/502 |
| 6,653,765 | B1 | 11/2003 | Levinson et al. | |
| 6,664,560 | B2 | 12/2003 | Emerson et al. | |
| 6,686,676 | B2 | 2/2004 | McNulty et al. | |
| 6,733,711 | B2 | 5/2004 | Durocher et al. | 264/272.14 |
| 6,734,033 | B2 | 5/2004 | Emerson et al. | |
| 6,744,196 | B1 | 6/2004 | Jeon | 313/498 |
| 6,759,266 | B1 | 7/2004 | Hoffman | 438/64 |
| 6,791,119 | B2 | 9/2004 | Slater, Jr. et al. | 257/99 |
| 6,791,259 | B1 | 9/2004 | Stokes | |
| 6,793,371 | B2 | 9/2004 | Lamke et al. | 362/241 |
| 6,812,500 | B2 | 11/2004 | Reeh et al. | 257/98 |
| 6,849,881 | B1 | 2/2005 | Volker et al. | |
| 6,853,010 | B2 | 2/2005 | Slater, Jr. et al. | 257/98 |
| 6,860,621 | B2 | 3/2005 | Bachl et al. | 362/373 |
| 6,919,683 | B1 | 7/2005 | Jang | 313/503 |
| 6,921,929 | B2 | 7/2005 | LeBoeuf et al. | 257/100 |
| 6,924,233 | B1 | 8/2005 | Chua et al. | |
| 6,936,862 | B1 | 8/2005 | Chang et al. | |
| 6,939,481 | B2 | 9/2005 | Srivastava | |
| 6,958,497 | B2 | 10/2005 | Emerson et al. | 257/94 |
| 6,967,116 | B2 | 11/2005 | Negley | |
| 7,023,019 | B2 | 4/2006 | Madea et al. | 257/89 |
| 7,029,935 | B2 | 4/2006 | Negley et al. | |
| 7,042,020 | B2 | 5/2006 | Negley | |
| 7,049,159 | B2 | 5/2006 | Lowery | 438/22 |
| 7,078,737 | B2 | 7/2006 | Yuri | |
| 7,160,012 | B2 | 1/2007 | Hilscher et al. | |
| 7,183,586 | B2 | 2/2007 | Ichihara | |
| 7,183,587 | B2 | 2/2007 | Negley et al. | 257/99 |
| 7,202,598 | B2 | 4/2007 | Juestel et al. | 313/503 |
| 7,217,583 | B2 | 5/2007 | Negley et al. | |
| 7,246,923 | B2 | 7/2007 | Conner | |
| 7,250,715 | B2 | 7/2007 | Mueller et al. | 313/485 |
| 7,259,402 | B2 | 8/2007 | Edmond et al. | |
| 7,286,296 | B2 | 10/2007 | Chaves et al. | 359/641 |
| 7,446,343 | B2 | 11/2008 | Mueller et al. | 257/89 |
| 7,566,639 | B2 | 7/2009 | Kohda | 438/463 |
| 7,601,550 | B2 | 10/2009 | Bogner | |
| 7,614,759 | B2 | 11/2009 | Negley | |
| 7,714,342 | B2 | 5/2010 | Lee et al. | 257/98 |
| 8,610,145 | B2 | 12/2013 | Yano | 257/98 |
| 2001/0000622 | A1 | 5/2001 | Reeh et al. | |
| 2001/0007484 | A1* | 7/2001 | Sakamaki | G11B 23/0302 349/2 |
| 2001/0015442 | A1 | 8/2001 | Kondoh et al. | 257/79 |
| 2001/0019177 | A1 | 9/2001 | Sugihara | 257/780 |
| 2001/0038166 | A1 | 11/2001 | Weber | 264/272 |
| 2002/0001869 | A1 | 1/2002 | Fjelstad | |
| 2002/0006040 | A1 | 1/2002 | Kamada et al. | |
| 2002/0048905 | A1 | 4/2002 | Ikegami et al. | 438/464 |
| 2002/0056847 | A1 | 5/2002 | Uemura | |
| 2002/0057057 | A1 | 5/2002 | Sorg | |
| 2002/0063520 | A1 | 5/2002 | Yu et al. | |
| 2002/0070449 | A1 | 6/2002 | Yagi et al. | |
| 2002/0079837 | A1 | 6/2002 | Okazaki | |
| 2002/0088985 | A1 | 7/2002 | Komoto et al. | |
| 2002/0096789 | A1 | 7/2002 | Bolken | |
| 2002/0105266 | A1 | 8/2002 | Juestel et al. | |
| 2002/0123164 | A1 | 9/2002 | Slater, Jr. et al. | |
| 2002/0158578 | A1 | 10/2002 | Eliashevich et al. | 313/512 |
| 2002/0185965 | A1 | 12/2002 | Collins, III et al. | |
| 2003/0006418 | A1 | 1/2003 | Emerson et al. | |
| 2003/0038596 | A1 | 2/2003 | Ho | |
| 2003/0066311 | A1 | 4/2003 | Li et al. | |
| 2003/0079989 | A1 | 5/2003 | Klocke et al. | |
| 2003/0121511 | A1 | 7/2003 | Hashimura | |
| 2003/0181122 | A1 | 9/2003 | Collins et al. | 445/24 |
| 2003/0207500 | A1 | 11/2003 | Pichler et al. | |
| 2004/0004435 | A1 | 1/2004 | Hsu | |
| 2004/0012958 | A1 | 1/2004 | Takuma | |
| 2004/0037949 | A1 | 2/2004 | Wright | |
| 2004/0038442 | A1 | 2/2004 | Kinsman | |
| 2004/0041159 | A1 | 3/2004 | Yuri et al. | |
| 2004/0041222 | A1 | 3/2004 | Loh | |
| 2004/0056260 | A1 | 3/2004 | Slater et al. | 257/79 |
| 2004/0061115 | A1 | 4/2004 | Kozawa et al. | |
| 2004/0061433 | A1 | 4/2004 | Izuno et al. | 313/498 |
| 2004/0106234 | A1 | 6/2004 | Sorg et al. | |
| 2004/0124229 | A1 | 7/2004 | Stokes | |
| 2004/0140765 | A1 | 7/2004 | Takekuma et al. | |
| 2004/0164307 | A1 | 8/2004 | Mueller-Mach et al. | |
| 2004/0164311 | A1 | 8/2004 | Uemura | |
| 2004/0170018 | A1 | 9/2004 | Nawashiro | |
| 2004/0173806 | A1 | 9/2004 | Chua | |
| 2004/0180475 | A1 | 9/2004 | Shibata et al. | 438/127 |
| 2004/0188697 | A1 | 9/2004 | Brunner et al. | |
| 2004/0188698 | A1 | 9/2004 | Ishimura | 257/99 |
| 2004/0245530 | A1 | 12/2004 | Kameyama | |
| 2004/0256974 | A1 | 12/2004 | Mueller-Mach et al. | |
| 2004/0263073 | A1 | 12/2004 | Baroky et al. | 313/512 |
| 2005/0001225 | A1 | 1/2005 | Yoshimura et al. | |
| 2005/0002168 | A1 | 1/2005 | Narhi et al. | |
| 2005/0006651 | A1 | 1/2005 | LeBoeuf et al. | 257/79 |
| 2005/0033138 | A1 | 2/2005 | Iwao | |
| 2005/0051782 | A1 | 3/2005 | Negley et al. | |
| 2005/0062140 | A1 | 3/2005 | Leung et al. | |
| 2005/0072981 | A1 | 4/2005 | Suenaga | 257/88 |
| 2005/0080193 | A1 | 4/2005 | Wouters et al. | 525/191 |
| 2005/0122031 | A1 | 6/2005 | Itai | |
| 2005/0145991 | A1 | 7/2005 | Sakamoto et al. | |

(56) References Cited

U.S. PATENT DOCUMENTS

| | | | |
|---|---|---|---|
| 2005/0167682 A1 | 8/2005 | Fukasawa | |
| 2005/0184305 A1 | 8/2005 | Ueda | |
| 2005/0184638 A1 | 8/2005 | Mueller et al. | 313/485 |
| 2005/0194606 A1 | 9/2005 | Oohata | 257/99 |
| 2005/0196886 A1 | 9/2005 | Jager et al. | |
| 2005/0211991 A1 | 9/2005 | Mori et al. | |
| 2005/0219835 A1 | 10/2005 | Nagayama | |
| 2005/0221519 A1 | 10/2005 | Leung et al. | |
| 2005/0243237 A1* | 11/2005 | Sasuga | F21V 14/003 349/57 |
| 2005/0259423 A1* | 11/2005 | Heuser | H01L 33/44 362/293 |
| 2005/0265404 A1 | 12/2005 | Ashdown | |
| 2005/0269592 A1 | 12/2005 | Lee et al. | 257/100 |
| 2005/0280894 A1 | 12/2005 | Hartkop et al. | 359/464 |
| 2006/0001046 A1 | 1/2006 | Batres et al. | |
| 2006/0001466 A1 | 1/2006 | Luecke et al. | |
| 2006/0003477 A1 | 1/2006 | Braune et al. | 438/29 |
| 2006/0007207 A1* | 1/2006 | Kawaguchi | G09G 3/3651 345/204 |
| 2006/0027820 A1 | 2/2006 | Cao | 257/89 |
| 2006/0060867 A1 | 3/2006 | Suehiro | |
| 2006/0060872 A1 | 3/2006 | Edmond et al. | |
| 2006/0060874 A1 | 3/2006 | Edmond et al. | |
| 2006/0060879 A1 | 3/2006 | Edmond et al. | |
| 2006/0065906 A1 | 3/2006 | Harada | |
| 2006/0091788 A1 | 5/2006 | Yan | |
| 2006/0102991 A1 | 5/2006 | Sakano | |
| 2006/0124947 A1* | 6/2006 | Mueller | C09K 11/0883 257/98 |
| 2006/0138937 A1 | 6/2006 | Ibbetson | |
| 2006/0145170 A1 | 7/2006 | Cho | 257/95 |
| 2006/0157721 A1 | 7/2006 | Tran et al. | |
| 2006/0189098 A1 | 8/2006 | Edmond | |
| 2006/0202105 A1 | 9/2006 | Krames et al. | |
| 2006/0267042 A1 | 11/2006 | Izuno | |
| 2006/0284195 A1 | 12/2006 | Nagai | |
| 2007/0012940 A1 | 1/2007 | Suh et al. | |
| 2007/0034995 A1 | 2/2007 | Kameyama | |
| 2007/0037307 A1 | 2/2007 | Donofrio | |
| 2007/0092636 A1 | 4/2007 | Thompson et al. | |
| 2007/0096131 A1 | 5/2007 | Chandra | |
| 2007/0114559 A1* | 5/2007 | Sayers | H01L 33/44 257/100 |
| 2007/0138941 A1* | 6/2007 | Jin | H01L 27/3232 313/503 |
| 2007/0158668 A1 | 7/2007 | Tarsa et al. | |
| 2007/0158669 A1 | 7/2007 | Lee et al. | |
| 2007/0165403 A1 | 7/2007 | Park | 362/247 |
| 2007/0170447 A1 | 7/2007 | Negley | |
| 2007/0215890 A1 | 9/2007 | Harbers et al. | 257/98 |
| 2007/0259206 A1 | 11/2007 | Oshio | |
| 2007/0263377 A1 | 11/2007 | Butler | |
| 2007/0278502 A1 | 12/2007 | Shakuda et al. | 257/88 |
| 2008/0006815 A1 | 1/2008 | Wang et al. | |
| 2008/0080165 A1 | 4/2008 | Kim | |
| 2008/0093615 A1 | 4/2008 | Lin | |
| 2008/0106893 A1 | 5/2008 | Johnson et al. | |
| 2008/0149455 A1 | 6/2008 | Nagai | |
| 2008/0173844 A1 | 7/2008 | Chitnis et al. | 257/98 |
| 2008/0173884 A1* | 7/2008 | Chitnis | H01L 33/44 257/98 |
| 2008/0179611 A1 | 7/2008 | Chitnis et al. | 257/98 |
| 2008/0203410 A1 | 8/2008 | Brunner et al. | |
| 2008/0283865 A1 | 11/2008 | Yoo | |
| 2009/0057690 A1* | 3/2009 | Chakraborty | H01L 33/44 257/88 |
| 2009/0086492 A1 | 4/2009 | Meyer | F21V 3/02 362/294 |
| 2009/0095966 A1 | 4/2009 | Keller et al. | 257/98 |
| 2009/0101930 A1* | 4/2009 | Li | G02B 6/005 257/98 |
| 2009/0116217 A1* | 5/2009 | Teng | F21K 9/64 362/84 |
| 2009/0154195 A1 | 6/2009 | Ishii et al. | 362/612 |
| 2009/0268461 A1 | 10/2009 | Deak et al. | |
| 2009/0322197 A1* | 12/2009 | Helbing | H01L 33/507 313/46 |
| 2010/0020532 A1 | 1/2010 | Negley | |
| 2010/0213808 A1* | 8/2010 | Shi | H01L 33/483 313/46 |
| 2011/0037084 A1* | 2/2011 | Sekii | F21V 5/04 257/89 |
| 2011/0050098 A1* | 3/2011 | Lenk | F21V 3/0418 315/32 |
| 2012/0043886 A1 | 2/2012 | Ji et al. | 315/51 |

FOREIGN PATENT DOCUMENTS

| | | |
|---|---|---|
| CN | 1372330 A | 10/2002 |
| CN | 1455960 | 11/2003 |
| CN | 1476050 | 2/2004 |
| CN | 1547265 | 11/2004 |
| CN | 1866561 A | 11/2006 |
| DE | 19638667 | 4/1998 |
| DE | 19945672 A1 | 4/2000 |
| DE | 69702929 | 2/2001 |
| DE | 102005000800 | 8/2005 |
| DE | 102005013265 | 12/2005 |
| DE | 102005042814 | 4/2006 |
| DE | 102005062514 | 3/2007 |
| DE | 102005058127 | 6/2007 |
| DE | 102007022090 | 11/2008 |
| EP | 0732740 A2 | 9/1996 |
| EP | 1017112 | 7/2000 |
| EP | 1059678 | 12/2000 |
| EP | 1138747 | 4/2001 |
| EP | 1 138 747 A2 | 10/2001 |
| EP | 1198016 A2 | 10/2001 |
| EP | 1198005 A1 | 4/2002 |
| EP | 1198016 A2 | 4/2002 |
| EP | 1367655 A1 | 3/2003 |
| EP | 1395215 | 1/2004 |
| EP | 1601030 A2 | 11/2005 |
| EP | 1724848 | 11/2006 |
| EP | 1724848 A | 11/2006 |
| EP | 1804304 A2 | 7/2007 |
| EP | 1935452 A1 | 6/2008 |
| FR | 2704690 | 11/1994 |
| JP | 61048951 | 10/1986 |
| JP | 59027559 | 2/1987 |
| JP | 02-086150 | 3/1990 |
| JP | 402086150 | 3/1990 |
| JP | 4233454 | 8/1992 |
| JP | 10107325 | 4/1998 |
| JP | H 10107325 | 4/1998 |
| JP | 10-163525 | 6/1998 |
| JP | 10163525 | 6/1998 |
| JP | 10163525 A | 6/1998 |
| JP | 10247750 A | 9/1998 |
| JP | 10261821 A | 9/1998 |
| JP | H 0261821 | 9/1998 |
| JP | 11087778 | 3/1999 |
| JP | 11276932 | 10/1999 |
| JP | 2000002802 | 1/2000 |
| JP | 2002101147 | 4/2000 |
| JP | 2000-164937 A | 6/2000 |
| JP | 2000164930 | 6/2000 |
| JP | 2000164937 | 6/2000 |
| JP | 2000208820 | 7/2000 |
| JP | 2000208820 A | 7/2000 |
| JP | 2000243728 | 8/2000 |
| JP | 2000277551 A | 10/2000 |
| JP | 2000-349346 | 12/2000 |
| JP | 2000349346 | 12/2000 |
| JP | 2001308116 A | 11/2001 |
| JP | 2001345480 | 12/2001 |
| JP | 2002009097 A | 1/2002 |
| JP | 2002-050799 | 2/2002 |
| JP | 200250799 | 2/2002 |
| JP | 2002050799 | 2/2002 |
| JP | 2002-093830 | 3/2002 |

(56) References Cited

FOREIGN PATENT DOCUMENTS

| | | |
|---|---|---|
| JP | 2002076445 | 3/2002 |
| JP | 2002-118293 | 4/2002 |
| JP | 2002118293 | 4/2002 |
| JP | 2002118293 A | 4/2002 |
| JP | 2002261325 | 9/2002 |
| JP | 2002280607 | 9/2002 |
| JP | 2002319704 | 10/2002 |
| JP | 2002374006 | 12/2002 |
| JP | 2003-007929 | 1/2003 |
| JP | 20037929 A | 1/2003 |
| JP | 2003007929 | 1/2003 |
| JP | 2003046141 | 2/2003 |
| JP | 2003-115614 | 4/2003 |
| JP | 2003110153 | 4/2003 |
| JP | 2003115614 | 4/2003 |
| JP | 2003-170465 | 6/2003 |
| JP | 2003-197655 | 7/2003 |
| JP | 2003318448 | 7/2003 |
| JP | 2003224307 | 8/2003 |
| JP | 2003234511 | 8/2003 |
| JP | 2003-258011 | 9/2003 |
| JP | 2004-031856 | 1/2004 |
| JP | 2004031856 | 1/2004 |
| JP | 2004095765 | 3/2004 |
| JP | 2004134699 | 4/2004 |
| JP | 2004186488 | 7/2004 |
| JP | 2004-266240 | 9/2004 |
| JP | 2004266240 | 9/2004 |
| JP | 3589187 B2 | 11/2004 |
| JP | 2004-363342 | 12/2004 |
| JP | 2004363342 | 12/2004 |
| JP | 2005019838 | 1/2005 |
| JP | 2005033138 A | 2/2005 |
| JP | 2005064113 | 3/2005 |
| JP | 2005167079 | 6/2005 |
| JP | 2005-252222 | 9/2005 |
| JP | 2005252222 | 9/2005 |
| JP | 2005298817 | 10/2005 |
| JP | 2006032387 | 2/2006 |
| JP | 2006054209 | 2/2006 |
| JP | 20060495533 | 2/2006 |
| JP | 2006080565 | 3/2006 |
| JP | 2006114637 | 4/2006 |
| JP | 2006165416 | 6/2006 |
| JP | 2006245020 | 6/2006 |
| JP | 2006-245020 | 9/2006 |
| JP | 2006-253370 | 9/2006 |
| JP | 2006253370 | 9/2006 |
| JP | 2006313886 | 11/2006 |
| JP | 2007063538 | 3/2007 |
| JP | 2008-129043 A | 6/2008 |
| JP | 2008532281 | 8/2008 |
| JP | 2008-218511 A | 9/2008 |
| JP | 2000-299334 | 10/2010 |
| KR | 200412776 | 2/2004 |
| KR | 2004-0017926 | 3/2004 |
| KR | 200417926 | 3/2004 |
| KR | 200429313 | 4/2004 |
| TW | 522423 | 3/2003 |
| TW | 581325 U | 3/2004 |
| TW | 595012 | 6/2004 |
| WO | WO 0033390 | 6/2000 |
| WO | WO 0124283 | 4/2001 |
| WO | WO 02061847 A2 | 8/2002 |
| WO | WO 03001612 | 1/2003 |
| WO | WO 03/021668 | 3/2003 |
| WO | WO 2004020704 | 3/2004 |
| WO | WO 2005101445 A1 | 10/2005 |
| WO | WO 2005101909 | 10/2005 |
| WO | WO 2005121641 A1 | 12/2005 |
| WO | WO 2006033695 A2 | 3/2006 |
| WO | WO 2006036251 A1 | 4/2006 |
| WO | WO 2006/065015 | 6/2006 |
| WO | WO 2006135496 A2 | 12/2006 |
| WO | WO 2007107903 A1 | 9/2007 |
| WO | WO 2007136956 | 11/2007 |
| WO | WO 2008003176 A1 | 1/2008 |
| WO | WO 2009060356 A2 | 5/2009 |
| WO | WO 2009093163 A2 | 7/2009 |
| WO | WO 2010035171 A2 | 4/2010 |

OTHER PUBLICATIONS

Patent Abstracts of Japan 11-040858, Feb. 12, 1999.
Patent Abstracts of Japan 2001-181613, Jul. 3, 2001.
Patent Abstracts of Japan, 2003-258011, Sep. 12, 2003.
Patent Abstracts of Japan, 2002-093830, Mar. 29, 2002.
NPO-30394 Electrophoretic Deposition for Fabricating Microbatteries p. 1-2, NASA Tech Briefs Issue May 3, 2003.
Office Action from U.S. Appl. No. 11/982,276, dated Feb. 18, 2010.
Office Action from U.S. Appl. No. 11/398,214, dated Nov. 12, 2010.
Office Action from U.S. Appl. No. 11/656,759, dated May 21, 2010.
Office Action from U.S. Appl. No. 11/656,759, dated Mar. 9, 2011.
Office Action from U.S. Appl. No. 12/077,638, dated Dec. 21, 2010.
Response to OA from U.S. Appl. No. 11/595,720, dated May 14, 2010, filed Jul. 6, 2010.
Office Action from U.S. Appl. No. 12/506,989, dated Mar. 8, 2011.
Office Action from U.S. Appl. No. 12/008,477, dated Mar. 1, 2010.
Office Action from U.S. Appl. No. 11/656,759, dated Nov. 25, 2009.
Office Action from U.S. Appl. No. 11/881,683, dated Feb. 5, 2010.
Office Action from U.S. Appl. No. 11/982,276, dated Mar. 25, 2010.
Office Action from U.S. Appl. No. 11/827,626, dated Apr. 1, 2011.
Notice of Allowance from U.S. Appl. No. 10/666,399, dated Oct. 14, 2010.
Office Action from U.S. Appl. No. 11/398,214, dated Dec. 11, 2009.
Office Action from U.S. Appl. No. 12/506,989, dated Jul. 23, 2010.
Office Action from U.S. Appl. No. 10/666,399, dated Dec. 22, 2009.
Response to Office Action U.S. Appl. No. 12/077,638, OA dated Jul. 7, 2010, Resp. filed Aug. 30, 2010.
Response to Office Action U.S. Appl. No. 11/656,759, OA dated Nov. 25, 2009, Resp. filed Apr. 26, 2010.
Response to Office Action U.S. Appl. No. 11/899,790, OA dated Jun. 2, 2010, Resp. filed Nov. 1, 2010.
Response to Office Action U.S. Appl. No. 10/666,399, OA dated Dec. 22, 2009, Resp. filed Mar. 22, 2010.
Office Action from U.S. Appl. No. 11/881,683, dated Oct. 14, 2010.
Office Action from U.S. Appl. No. 11/899,790, dated Mar. 21, 2011.
Office Action from U.S. Appl. No. 12/077,638, dated Sep. 22, 2010.
Response to Office Action U.S. Appl. No. 11/398,214, OA dated Dec. 11, 2009, Resp. filed Mar. 2, 2010.
Response to Office Action U.S. Appl. No. 10/666,399, OA dated May 11, 2010, Resp. filed Aug. 11, 2010.
Response to Office Action U.S. Appl. No. 12/008,477, OA dated Mar. 1, 2010, Resp. filed May 26, 2010.
Response to Office Action U.S. Appl. No. 11/982,276, OA dated Mar. 25, 2010, Resp. filed Jun. 21, 2010.
Response to Office Action U.S. Appl. No. 11/881,683, OA dated May 12, 2010, Resp. filed Aug. 3, 2010.
Office Action from U.S. Appl. No. 11/982,276, dated Aug. 19, 2010.
Office Action from U.S. Appl. No. 12/077,638, dated Jul. 7, 2010.
Office Action from U.S. Appl. No. 10/666,399, dated May 11, 2010.
Response to OA from U.S. Appl. No. 12/077,638, OA dated Dec. 8, 2009, filed Feb. 26, 2010.
Response to OA from U.S. Appl. No. 11/982,276, OA dated Dec. 7, 2009, filed Feb. 5, 2010.
Response to OA from U.S. Appl. No. 11/982,276, OA dated Aug. 19, 2010, filed Nov. 2, 2010.
Office Action from U.S. Appl. No. 11/595,720, dated May 14, 2010.
Office Action from U.S. Appl. No. 11/827,626, dated Oct. 7, 2010.
Office Action from U.S. Appl. No. 12/008,477, dated Oct. 7, 2010.
Office Action from U.S. Appl. No. 11/881,683, dated May 12, 2010.
Office Action from U.S. Appl. No. 11/899,790, dated Jun. 2, 2010.
Notice of Rejection (Final) in Japanese Patent Application No. 2006-526964 dated Feb. 22, 2011.
Minutes of Oral Proceedings (EPO Form 2009) in European Patent Application No. 05808825.3 dated Feb. 3, 2011.
Summons to Attend Oral Proceedings in European Patent Application No. 05808825.3 dated Feb. 3, 2011.

(56) References Cited

OTHER PUBLICATIONS

Office Action from Taiwan Patent Application No. 093128231 dated Apr. 21, 2011.
Second Office Action for Chinese Patent Application No. 200780050127.2 dated Jun. 15, 2011.
International Preliminary Examination Report for PCT Application No. PCT/US07/24366 dated Jun. 29, 2011.
International Preliminary Examination Report for PCT Application No. PCT/US07/24367 dated Jun. 29, 2011.
Decision to Refuse a European Patent Application regarding EP 05 808 825.3 dated Jun. 14, 2011.
Office Action in Korean Patent Application No. 10-2007-7008694 dated Aug. 7, 2011.
Nichia Corp. White LED Part No. NSPW300BS, Specification for Nichia White LED, Model NSPW300BS Jan. 14, 2004.
Nichia Corp. White LED Part No. NSPW312BS, Specification for Nichia White LED, Model NSPW312BS Jan. 14, 2004.
Cree EZ700 and EZ1000 EZBright LED chip data sheets.
Notification of Reasons for Rejection for Japanese Patent Application No. 2009-547219 dated Sep. 16, 2011.
Notification of Reasons for Rejection for Japanese Patent Application No. 2009-547218 dated Sep. 16, 2011.
Notice of Rejection of Japanese Patent Application No. 2006-526964 dated Sep. 13, 2011.
Notice of Reasons for Rejection for Japanese Patent Application No. JP 2008-317576 dated Sep. 13, 2011.
Notification of the First Office Action for Chinese Patent Application No. CN 201110029365.3 dated Jan. 4, 2012.
Office Action U.S. Appl. No. 12/008,477, dated Apr. 12, 2011.
Response to Office Action U.S. Appl. No. 12/008,477, filed Jun. 27, 2011.
Office Action U.S. Appl. No. 11/899,790, dated Jul. 27, 2011.
Response to Office Action U.S. Appl. No. 11/899,790, filed Nov. 22, 2011.
Office Action U.S. Appl. No. 12/506,989, dated Jul. 20, 2011.
Response to Office Action U.S. Appl. No. 12/506,989, filed Nov. 21, 2011.
Office Action U.S. Appl. No. 12/287,764, dated Jul. 30, 2010.
Response to Office Action U.S. Appl. No. 12/287,764, filed Nov. 30, 2010.
Office Action U.S. Appl. No. 11/956,989, dated Apr. 16, 2010.
Response to Office Action U.S. Appl. No. 11/956,989, filed Jun. 14, 2010.
Response to Office Action U.S. Appl. No. 11/956,989, filed Jul. 14, 2010.
Office Action U.S. Appl. No. 12/287,764, dated Mar. 25, 2010.
Response to Office Action U.S. Appl. No. 12/287,764, filed Jul. 21, 2010.
Office Action U.S. Appl. No. 12/287,764, dated May 17, 2011.
Response to Office Action U.S. Appl. No. 12/287,764, filed Oct. 10, 2011.
Office Action U.S. Appl. No. 13/072,371, dated Oct. 5, 2011.
Response to Office Action U.S. Appl. No. 13/072,371, filed Dec. 23, 2011.
Office Action U.S. Appl. No. 11/656,759, dated Sep. 23, 2011.
Response to Office Action U.S. Appl. No. 11/656,759, filed Jan. 16, 2012.
Office Action U.S. Appl. No. 12/008,477, dated Sep. 19, 2011.
Response to Office Action U.S. Appl. No. 12/008,477, filed Jan. 25, 2012.
Office Action U.S. Appl. No. 12/862,640, dated Aug. 19, 2011.
Response to Office Action U.S. Appl. No. 12/862,640, filed Feb. 21, 2012.
Office Action U.S. Appl. No. 12/287,764, dated Oct. 26, 2011.
Response to Office Action U.S. Appl. No. 12/287,764, filed Mar. 6, 2012.
Office Action U.S. Appl. No. 12/506,989, dated Dec. 27, 2011.
Office Action U.S. Appl. No. 11/899,790, dated Jan. 12, 2012.
Response to Office Action U.S. Appl. No. 11/899,790, filed Mar. 8, 2012.
Office Action U.S. Appl. No. 12/862,640, dated Mar. 9, 2012.
Office Action U.S. Appl. No. 12/287,764, dated Jan. 13, 2011.
Response to Office Action U.S. Appl. No. 12/287,764, filed May 5, 2011.
US RE34,681, 2/1995, Davis et al. (withdrawn)
PCT/US2010/049564, Filed Sep. 21, 2010, Search Report and Written Opinion.
Notice of Results of Re-Consideration Prior to Appeal from Korean Patent Application No. 10-2007-7008694, dated Sep. 21, 2012.
Rejection Decision for Chinese Patent Application No. 201110029365.3, dated Sep. 10, 2012.
Noting of Loss of Rights from European Application No. 04783941.0-2203/1665361, dated Nov. 6, 2012.
Rejection Decision from Taiwanese Patent Appl. No. 094122646, dated Dec. 14, 2012.
Decision of Rejection from Japanese Patent Appl. No. 2008-317576, dated Dec. 18, 2012.
Decision of Rejection from Japanese Patent Appl. No. 2006-526964, dated Dec. 18, 2012.
Second Office Action from Chinese Patent Application No. 20101029016.2, dated Dec. 24, 2012.
Official Action from European Patent Application No. 07874432.3, dated Nov. 13, 2012.
Official Action from European Patent Application No. 07840092.6, dated Nov. 13, 2012.
Notification of Reasons for Rejection for Japanese Patent Appl. No. 2011-279356, dated Jan. 23, 2013.
Office Action from Japanese Office Action, Application No. 2011-224055, dated Feb. 7, 2013.
Fourth Examination from European Patent Appl. No. 04 783 941.0-1552, dated Oct. 7, 2014.
Summons to attend oral proceedings from European Patent Appl. No. 411.52.106724/0, dated Sep. 9, 2014.
Notification of Reexamination from Chinese Patent Appl. No. 200780050127.2, dated Jun. 3, 2014.
Notification of Allowance from Taiwan Patent Appl. No. 101130701, dated Jul. 15, 2014.
Office Action and Search Report from Taiwan Patent Appl. No. 097110195, dated Jul. 18, 2014.
Office Action from U.S. Appl. No. 11/899,790, dated Jun. 25, 2014.
Notification of re-examination from Chinese Appl. No. 201010279016.2, dated Jan. 9, 2015.
Summons to attend Oral Proceedings from European Appl. No. 08171399.2, dated Jan. 16, 2015.
Decision of Re-Examination from Chinese Appl. No. 201080001658.4, dated Dec. 29, 2014.
Letter regarding unfavorable decision on appeal from Japanese Appl. No. 2011-279356, dated Nov. 12, 2014.
Preliminary Examination Report from Japanese Appl. No. 2012-026326, dated Oct. 1, 2014.
Third Office Action from Chinese Appl. No. 201210175686.9, dated Dec. 11, 2014.
Office Action from U.S. Appl. No. 13/429,053, dated Sep. 22, 2014.
Office Action from U.S. Appl. No. 12/862,640, dated Oct. 17, 2014.
Reexamination Decision from Chinese Patent Appl. No. 200780050127.2, dated Jan. 5, 2015.
Office Action from U.S. Appl. No. 14/209,652, dated Dec. 12, 2014.
Office Action from U.S. Appl. No. 12/506,989, dated Jan. 21, 2015.
Office Action from U.S. Appl. No. 14/446,240, dated Aug. 5, 2015.
Office Action from U.S. Appl. No. 12/506,989, dated Oct. 6, 2015.
Office Action from U.S. Appl. No. 12/862,640, dated Oct. 23, 2015.
Examination from European Patent Appl. No. 07 874 432.3=1551, dated Dec. 15, 2015.
Office Action from U.S. Appl. No. 14/494,795; dated Dec. 23, 2015.
Notice of Final Rejection from Korean Appl. No. 10-2009-7017407, dated Feb. 27, 2015.
Notice of Allowance from Taiwanese Appl. No. 096143968, dated Mar. 10, 2015.
Notice of Reasons for Rejection from Japanese Patent Appl. No. 2012-26327, dated Nov. 17, 2015.
Notice of Allowance from Chinese Patent Appl. No. 201210175686.9, dated Dec. 1, 2015.

(56) References Cited

OTHER PUBLICATIONS

Summons to Attend Oral Proceedings from European Patent Appl. No. 05808825/1797597, dated Nov. 17, 2015.
Office Action from German Patent Appl. No. 11 2006 002 251.2, dated Jul. 8, 2015.
Notice of Allowance from Korean Patent Appl. No. 9-5-2015-047659777, dated Jul. 16, 2015.
Communication of Intention to Grant and Minutes from European Appl. No. 08 171 399.2-1554, dated Jun. 19, 2015.
Decision of Rejection Letter from Chinese Patent Appl. No. 201010279016.2, dated Jun. 3, 2015.
Fourth Office Action from Chinese Patent Appl. No. 201210175686.9, dated Jul. 9, 2015.
Office Action from U.S. Appl. No. 12/862,640, dated Jun. 5, 2015.
Office Action from U.S. Appl. No. 12/506,989, dated Jun. 18, 2015.
Examination Report from European Patent Appl. No. 07840092.6, dated Feb. 23, 2016.
Office Action for U.S. Appl. No. 12/506,989; dated Jun. 3, 2016.
Notice for Rejection for Japanese Application No. 2012-026327; dated Jul. 5, 2016.
Office Action for U.S. Appl. No. 12/506,989; dated Jun. 16, 2017.
Foreign Office Action for European Application No. 07874432.3; dated Oct. 17, 2016.
Appeal Decision for Japanese Application No. 2012-26327; dated Oct. 27, 2016.
Office Action for U.S. Appl. No. 12/506,969; dated Dec. 15, 2016.
Summons to Attend Oral Proceedings for European Application No. 07840092.6; Dated Feb. 14, 2018.
Office Action for U.S. Appl. No. 12/862,640; dated Oct. 4, 2017.
Office Action for U.S. Appl. No. 12/506,989; dated Dec. 29, 2017.
Office Action (Brief Description of) from Chinese Patent Appl. No. 201010279016.2. dated Jan. 10, 2014.
IPT's Decision from Korean Patent Appl. No. 10-2007-7008694, dated Dec. 24, 2013.
Office Action from U.S. Appl. No. 12/862,640, dated Dec. 20, 2013.
Office Action from U.S. Appl. No. 11/656,759, dated Nov. 18, 2013.
Notice of Allowance from Taiwanese Patent appl. No. 097110195, dated Apr. 30, 2015.
Office Action from Taiwanese Patent Appl. No. 100107044 dated Jun. 4, 2015.
Notice of Allowance from Korean Patent Appl. No. 10-2009-7017405, dated Feb. 18, 2014.
Search Report from Taiwanese Patent appl. No. 096143968, dated Feb. 17, 2014.
Rejection Decision from Chinese Patent Appl. No. 201010279016.2, dated Jun. 21, 2013.
Examination Report from European Patent Appl. No. 04 783 941.0-1555, dated Jul. 25, 2013.
Examination Report for European Application No. 04 783 941.0-2203, dated Mar. 22, 2012.
Notification of First Office Action from Chinese Application No. 201010279016.21, dated Feb. 28, 2012.
Notification of the Third Office Action from Chinese Application No. 200780050127.2, dated Mar. 28, 2012.
Decision of Rejection from Japanese Application No. 2009-547218, dated Mar. 8, 2012.
Decision of Rejection from Japanese Application No. 2009-547219, dated Mar. 8, 2012.
Extended European Search Report Application No. 10012027.8-2203/2306526, dated Mar. 30, 2012.
Office Action for Taiwan Patent Application No. 094122646, dated Feb. 20, 2012.
Examination Report for European Application No. 08 171 399.2-2222, dated Mar. 26, 2012.
Office Action from U.S. Appl. No. 13/072,371, dated Mar. 29, 2012.
Response to OA from U.S. Appl. No. 13/072,371, filed May 16, 2012.
Office Action from U.S. Appl. No. 11/656,759, dated May 1, 2012.
Response to OA from U.S. Appl. No. 11/656,759, filed Jun. 26, 2012.
Office Action from U.S. Appl. No. 12/862,640, dated Jun. 29, 2012.
Response to OA from U.S. Appl. No. 12/862,640, filed Sep. 20, 2012.
Office Action from U.S. Appl. No. 12/506,989, dated Jul. 6, 2012.
Response to OA from Patent Appl. No. 12/506,989, filed Oct. 11, 2012.
Office Action from U.S. Appl. No. 13/072,371, dated Jul. 23, 2012.
Response to OA from U.S. Appl. No. 13/072,371, filed Oct. 17, 2012.
Office Action from U.S. Appl. No. 12/862,640, dated Oct. 2, 2012.
Response to OA from U.S. Appl. No. 12/862,640, filed Apr. 17, 2013.
Office Action from U.S. Appl. No. 12/506,989, dated Oct. 24, 2012.
Response to OA from U.S. Appl. No. 12/506,989, filed Dec. 4, 2012.
Office Action from U.S. Appl. No. 11/899,790, dated Dec. 5, 2012.
Response to OA from U.S. Appl. No. 11/899,790, filed Feb. 27, 2013.
Office Action from U.S. Appl. No. 12/506,989, dated Jan. 18, 2013.
Response to OA from U.S. Appl. No. 12/506,989, filed Apr. 18, 2013.
Office Action from U.S. Appl. No. 12/862,640, dated Jan. 24, 2013.
Office Action from U.S. Appl. No. 13/072,371, dated Jan. 30, 2013.
Response to OA from U.S. Appl. No. 13/072,371, filed Apr. 22, 2013.
Office Action from U.S. Appl. No. 11/656,759, dated Feb. 13, 2013.
Response to OA from U.S. Appl. No. 11/656,759, filed May 13, 2013.
Office Action from U.S. Appl. No. 11/656,759, dated Jul. 2, 2013.
Response to OA from U.S. Appl. No. 11/656,759, filed Aug. 21, 2013.
Office Action from U.S. Appl. No. 11/899,790, dated May 1, 2013.
Response to OA from U.S. Appl. No. 11/899,790, filed Jun. 18, 2013.
Office Action from U.S. Appl. No. 13/072,371, dated Apr. 30, 2013.
Office Action from U.S. Appl. No. 12/862,640, dated Apr. 30, 2013.
Office Action from U.S. Appl. No. 12/506,989, dated Sep. 5, 2013.
Office Action from U.S. Appl. No. 11/899,790, dated Sep. 17, 2013.
Office Action from U.S. Appl. No. 12/008,477, dated Sep. 3, 2013.
Interrogation from Japanese Patent Appl. No. 2008-317576, dated Jul. 9, 2013.
Decision of Final Rejection from Japanese Patent Appl. No. 2011-224055, dated Jul. 26, 2013.
Decision of Rejection from Japanese Patent appl. No. 2011-279356, dated Jul. 31, 2013.
Notice of Rejection from Japanese Patent Appl. No. 2008-527912, dated Jun. 5, 2013.
Notice of Rejection from Japanese Patent Appl. No. 2008-527912 dated Jun. 14, 2011.
International Preliminary Report on Patentability from Appl. No. PCT/US06/24884 dated: Jun. 12, 2008.
Nichia Corp. White LED, Part No. NSPW312BX, "Specification for Nichia White LED, Model NSW312BS", pp. 1-14, 2004.
Nichia Corp. White LED, Part No. NSPW300BS, Specifications for Nichia White LED, Model NSPW300BS, pp. 1-14, 2004.
Office Action from Japanese Patent Appl. No. 2007-216808, dated Sep. 6, 2010.
Office Action from Japanese Patent Appl. No. 2011-224055, dated Jan. 12, 2012.
Decision of Final Rejection from Japanese Patent Appl. No. 2007-216808, dated Jan. 1, 2011.
Office Action from German Patent Appl. No. 10 2007 040 841.4-33, dated Sep. 17, 2009.
Office Action from German Patent Appl. No. 10 2007 040 811.2, dated Sep. 17, 2009.
Office Action from Chinese Patent Appl. No. 20070148326.9, dated Jun. 19, 2009, 2 pages.
Schubert, "Light-Emitting Diodes", Cambridge University Press, 2003, pp. 92-96.
International Search Report and Written Opinion from Application No. PCT/US2011/001214, dated Mar. 21, 2012.
Notification of the First Office Action, Chinese Patent Application No. 201010279016.2, dated Feb. 28, 2012.

(56) References Cited

OTHER PUBLICATIONS

Decision of Rejection from Japanese Patent appl. No. 2012-02326, dated Apr. 8, 2014.
First Office Action and Search Report from Chinese Patent Appl. No. 2012-10175686.9, dated Mar. 31, 2014.
Translation of Office Action from Taiwanese Patent Appl. No. 096143968, dated Feb. 13, 2014.
Office Action from U.S. Appl. No. 11/899,790, dated Feb. 25, 2014.
Office Action from U.S. Appl. No. 12/506,989, dated Feb. 19, 2014.
First Office Action and Search Report from Chinese Patent Application No. 201210030627.2, dated Dec. 3, 2012.
Decision of Rejection from Japanese Patent Appl. No. 2012-026327, dated Apr. 8, 2014.
Brief Summary of Rejection Decision from Chinese Patent Appl. No. 201010279016.2 dated Apr. 22, 2014.
Preliminary Report from Japanese Patent Appl. No. 2013-020955 dated Dec. 26, 2013.
Preliminary Report from Japanese Patent Appl. No. 2013-024242 dated Feb. 26, 2014.
Office Action from Korean Patent Appl. No. 10-2009-7017407, dated Apr. 28, 2014.
Notification of Reexamination from Chinese Patent appl. No. 201110029365.3 dated May 7, 2014.
Office Action from U.S. Appl. No. 13/429,053, dated Apr. 11, 2014.
Office Action from U.S. Appl. No. 12/008,477, dated Apr. 25, 2014.
Response to OA from U.S. Appl. No. 12/008,477, filed May 27, 2014.
Office Action from U.S. Appl. No. 13/072,371, dated Apr. 29, 2014.
Office Action from U.S. Appl. No. 11/656,759, dated May 27, 2014.
Examination from European Appl. No. 04 783 941.0-1552, dated Mar. 6, 2014.
Office Action and Search Report from Taiwanese Patent Appl. No. 101130701, dated Feb. 6, 2014.
Search Report from Taiwanese Patent Appl. No. 097110195, dated Mar. 12, 2014.
Office Action from Korean Patent Appl. No. 10-2009-7017405, dated Oct. 23, 2013.
Appeal Decision to Grant a Patent from Japanese Patent No. 2007-506279, dated Oct. 28, 2013.
Office Action from U.S. Appl. No. 13/072,371, dated Nov. 8, 2013.
Board Decision from Chinese Patent Appl. No. 201110029365.3, dated Aug. 13, 2014.
Second Office Action from Chinese Patent Appl. No. 201210175686.9, dated Sep. 3, 2014.
Office Action from Taiwanese Patent Appl. No. 097110195, dated Sep. 9, 2014.
Office Action from U.S. Appl. No. 12/506,989, dated Aug. 8, 2014.
Office Action from U.S. Appl. No. 13/017,845, dated Sep. 11, 2014.

* cited by examiner

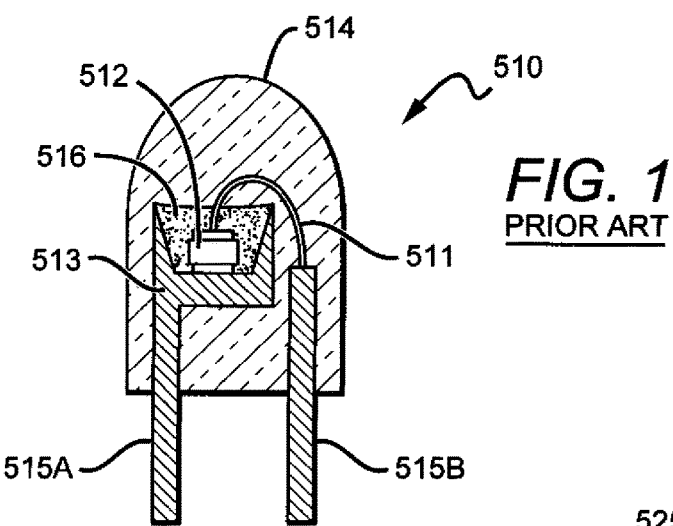
FIG. 1
PRIOR ART
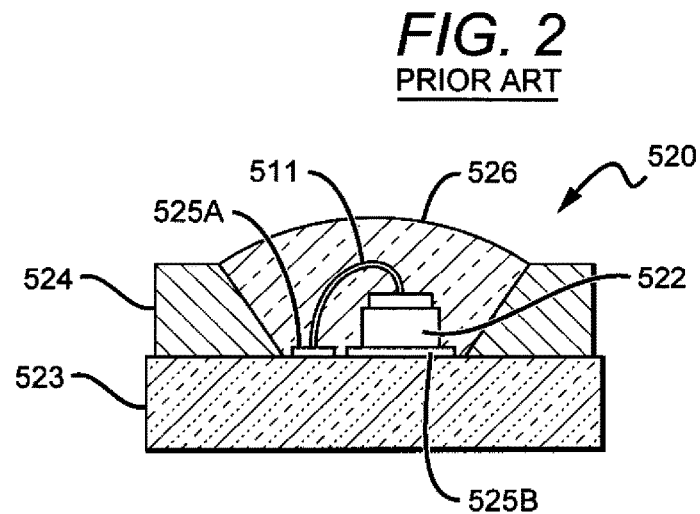
FIG. 2
PRIOR ART
FIG. 3a
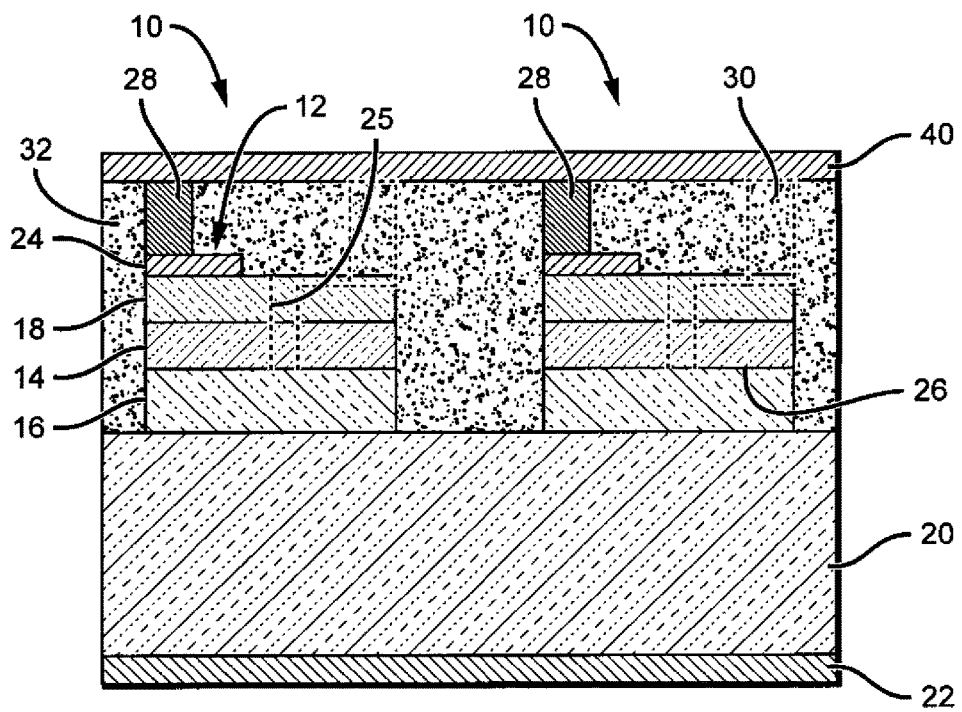

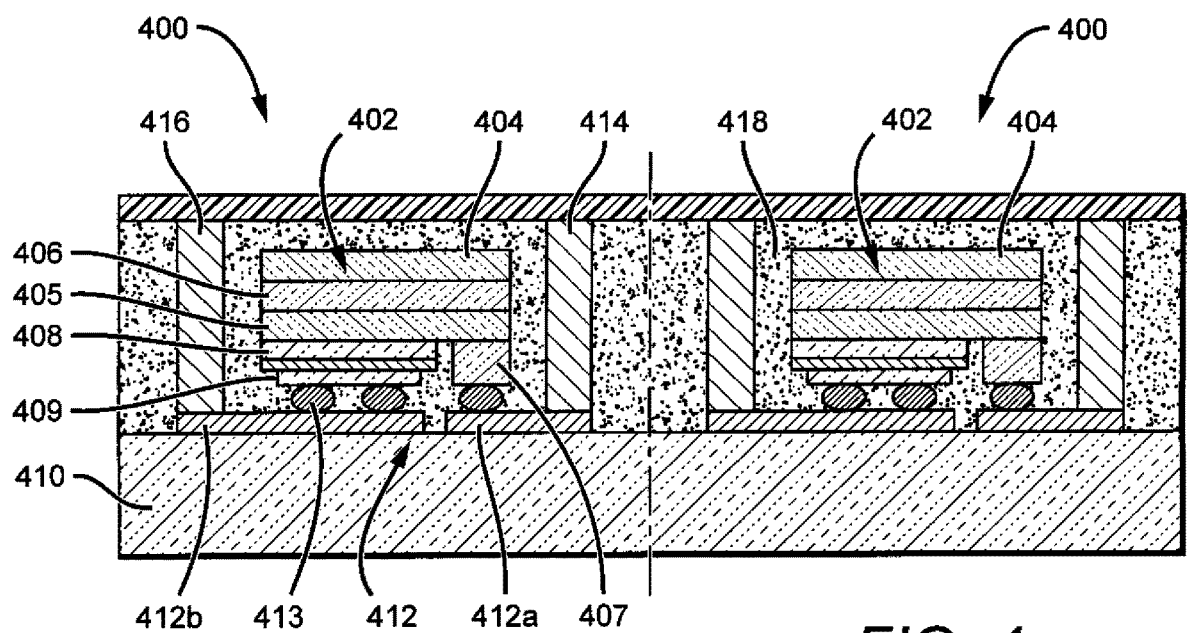
FIG. 4
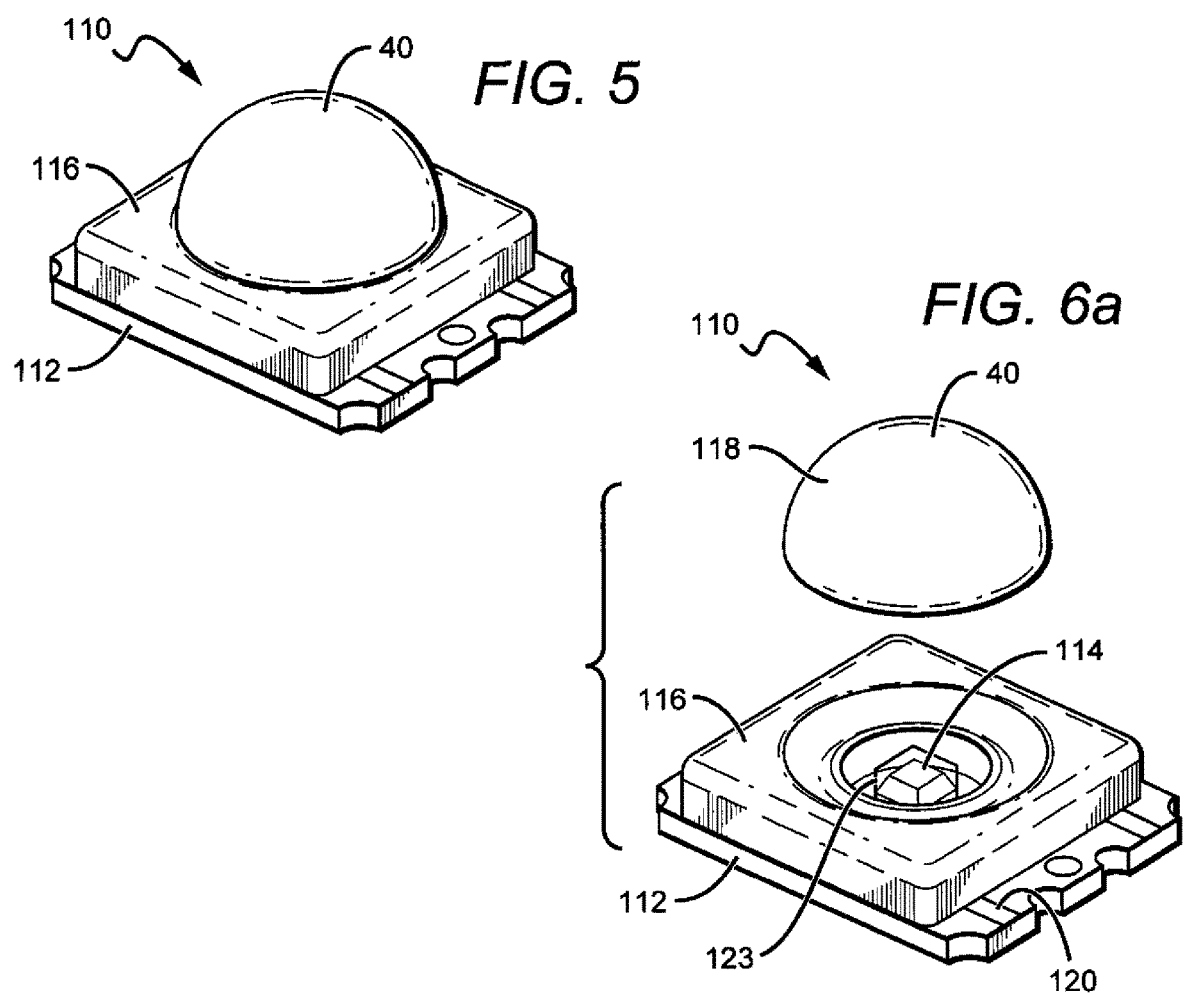
FIG. 5
FIG. 6a

LIGHT TRANSMISSION CONTROL FOR MASKING APPEARANCE OF SOLID STATE LIGHT SOURCES

BACKGROUND OF THE INVENTION

Field of the Invention

This invention relates to light emitters and light transmission control materials to mask their appearance when inactive, and in particular to solid state emitters having light transmission control materials to mask their appearance when inactive but becoming transparent when the solid state emitter is active.

Description of the Related Art

Light emitting diodes (LED or LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and extracted to the surrounding ambient from all transparent surfaces of the LED.

Conventional LEDs cannot generate white light from their active layers. Light from a blue emitting LED has been converted to white light by surrounding the LED with a yellow phosphor, polymer or dye, with a typical phosphor being cerium-doped yttrium aluminum garnet (Ce:YAG). The surrounding phosphor material "downconverts" the wavelength of some of the LED's blue light, changing its color to yellow. Some of the blue light passes through the phosphor without being changed while a substantial portion of the light is downconverted to yellow. The LED emits both blue and yellow light, which combine to provide a white light. In another approach light from a violet or ultraviolet emitting LED has been converted to white light by surrounding the LED with multicolor phosphors or dyes.

In order to use an LED chip in a circuit or other like arrangement, it is known to enclose an LED chip in a package to provide environmental and/or mechanical protection, color selection, light focusing and the like. An LED package also includes electrical leads, contacts or traces for electrically connecting the LED package to an external circuit. In a typical LED package 10 illustrated in FIG. 1, a single LED chip 512 is mounted on a reflective cup 513 by means of a solder bond or conductive epoxy. One or more wire bonds 511 connect the ohmic contacts of the LED chip 512 to leads 515A and/or 515B, which may be attached to or integral with the reflective cup 513. The reflective cup may be filled with an encapsulant material 516 which may contain a wavelength conversion material such as a phosphor. Light emitted by the LED at a first wavelength may be absorbed by the phosphor, which may responsively emit light at a second wavelength. The entire assembly is then encapsulated in a clear protective resin 514, which may be molded in the shape of a lens to collimate the light emitted from the LED chip 512. While the reflective cup 513 may direct light in an upward direction, optical losses may occur when the light is reflected (i.e. some light may be absorbed by the reflector cup due to the less than 100% reflectivity of practical reflector surfaces). In addition, heat retention may be an issue for a package, since it may be difficult to extract heat through the leads 515A, 515B.

A conventional LED package 520 illustrated in FIG. 2 may be more suited for high power operations which may generate more heat. In the LED package 520, one or more LED chips 522 are mounted onto a carrier such as a printed circuit board (PCB) carrier, substrate or submount 523. A metal reflector 524 mounted on the submount 523 surrounds the LED chip(s) 522 and reflects light emitted by the LED chips 522 away from the package 520. The reflector 524 also provides mechanical protection to the LED chips 522. One or more wirebond connections 527 are made between ohmic contacts on the LED chips 522 and electrical traces 525A, 525B on the submount 523. The mounted LED chips 522 are then covered with an encapsulant 526, which may provide environmental and mechanical protection to the chips while also acting as a lens. The metal reflector 524 is typically attached to the carrier by means of a solder or epoxy bond.

LED chips, such as those found in the LED package 520 of FIG. 2 can be coated by conversion material comprising one or more phosphors, with the phosphors absorbing at least some of the LED light. The LED chip can emit a different wavelength of light such that it emits a combination of light from the LED and the phosphor. The LED chip(s) can be coated with a phosphor using many different methods, with one suitable method being described in U.S. patent application Ser. Nos. 11/656,759 and 11/899,790, both to Chitnis et al. and both entitled "Wafer Level Phosphor Coating Method and Devices Fabricated Utilizing Method". Alternatively, the LEDs can be coated using other methods such as electrophoretic deposition (EPD), with a suitable EPD method described in U.S. patent application Ser. No. 11/473,089 to Tarsa et al. entitled "Close Loop Electrophoretic Deposition of Semiconductor Devices".

In these arrangements the phosphor material is on or in close proximity to the LED epitaxial layers and in some instances comprises a conformal coat over the LED. In these arrangements, the phosphor material can be subjected to direct chip heating which can cause the phosphor material to heat. In other embodiments the phosphor is placed remote from the LED.

Lamps have been developed utilizing solid state light sources, such as LEDs, with conversion material on or around the LEDs. Such arrangements are disclosed in U.S. patent application Ser. No. 11/974,431 to Keller et al., entitled "Multiple Conversion Material Light Emitting Diode Package and Method of Fabricating Same." Lamps have also been developed utilizing solid state light sources, such as LEDs, with a conversion material that is separated from or remote to the LEDs. Such arrangements are disclosed in U.S. Pat. No. 6,350,041 to Tarsa et al., entitled "High Output Radial Dispersing Lamp Using a Solid State Light Source." The lamps described in this patent can comprise a solid state light source that transmits light through a separator to a disperser having a phosphor. The disperser can disperse the light in a desired pattern and/or changes its color by converting at least some of the light through a phosphor.

These conversion material coatings and dispersers in solid state emitters are visible to users when the emitter is inactive or not energized. For example, solid state light sources that generate white light by using phosphors to convert blue light have distinct yellow or yellow-orange appearances. In some applications these visible conversion materials can be considered unsightly by users and consumers, which may lead to adoption avoidance in the market. To mask this appearance, present technology relies on diffusive or semitransparent materials to modify the visibility of conversion materials in solid state light emitters. These solutions use materials which remain diffusive or semitransparent even when the light is energized resulting in significant transmission losses of light, 4% up to 50%, reducing performance of the light source.

In other applications, such as windows, privacy glass, oven windows, and artistic displays, reversibly light scattering materials have been used within surfaces or to coat surfaces to change their ability to reversibly scatter light or transparency. These coatings can be thermally or electrically triggered. Examples of these materials and their functions can be found in U.S. Pat. Nos. 6,362,303, 4,273,422, and 6,416,827.

SUMMARY OF THE INVENTION

The present embodiments advantageously address the needs above as well as other needs by providing light emitter devices, packages, lamp systems and methods of manufacturing same. Some embodiments provide a light emitting diode (LED) chip, comprising an LED and a coating at least partially covering the LED. This coating reversibly masking the appearance of the at least partially covered LED when the LED is inactive.

Other embodiments provide an LED package that comprises an LED chip and package leads electrically connected to said LED chip. The package further comprises an encapsulation surrounding the LED chip and electrical connections and a light transmission control material at least partially covering the LED chip. This light transmission control material reversibly masking the appearance of the at least partially covered LED chip when the LED chip is inactive.

Other embodiments provide an LED based lamp that comprises an LED light source. A phosphor is arranged remote to the light source such that light emitted from the light source passes through the phosphor and is converted by the phosphor. A light transmission control material applied at least partially outside the LED light source and the phosphor to reversibly mask the appearance of the LED light source and the phosphor.

Some further embodiments provide a method for masking the appearance of inactive light emitters. These embodiments can comprise providing at least one light emitter. Providing a light transmission control material over the at least one light emitter to reversibly mask the appearance of the at least one light emitter while the at least one light emitter is inactive.

The above and other aspects, features and advantages of the present embodiments will be more apparent from the following more particular description thereof, presented in conjunction with the following drawings.

BRIEF DESCRIPTION OF THE DRAWINGS

FIG. 1 shows a sectional view of one embodiment of a prior art LED lamp;

FIG. 2 shows a sectional view of another embodiment of a prior art LED lamp;

FIG. 3a is a sectional view of one embodiment of an LED chip wafer at fabrication steps according to the present invention;

FIG. 4 is a sectional view of one embodiment of a flip-chip LED chip wafer according to the present invention;

FIG. 5 is a perspective view of one embodiment of an LED package according to the present invention;

FIG. 6a is a perspective view of one embodiment of an LED package according to the present invention;

DETAILED DESCRIPTION OF THE INVENTION

Figure 3B:
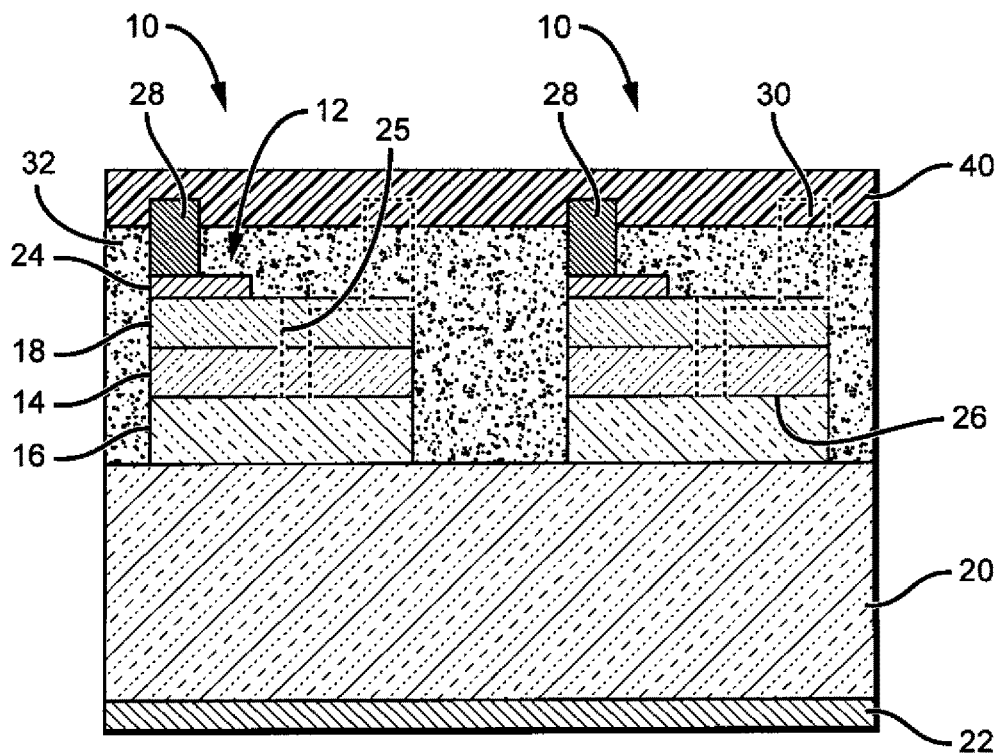
FIG. 3b is a sectional view of one embodiment of an LED chip wafer at fabrication steps according to the present invention.

The present invention is directed to different embodiments of light emitter devices, components, and bulb structures comprising a light transmission control coating or material that can mask the visibility of these components while they are inactive, while minimizing loss of emitter performance while active. This reduces or eliminates the visibility of conversion materials on emitters or the presence of several emitters while the devices are inactive, improving the appearance of these lighting solutions. The present invention is also directed to lamp structures comprising a light transmission control coating or material that serves to mask the phosphor or conversion material from the view by the lamp user when the lamp is inactive or not energized, but also becomes clear to allow transfer of light from the lamp's light source without significant losses of efficiency such as those caused by the use of a diffuser. The present invention is also directed to methods of manufacturing the above. In one embodiment, the light transmission control coating or material can be arranged to also control light dispersion patterns.

In different lamp embodiments the conversion material can comprise one or more phosphors which can be kept remote from the light source or in a phosphor carrier window. Remote phosphor or phosphor carrier windows can be visible to users and can be considered unsightly, but are advantageous because of many reasons such as reduction of heat related degradation of the phosphor and increased reliability. In these embodiments, an area on the phosphor can be coated with a light transmission control material. This light transmission control material can mask the appearance of the phosphor or other conversion material by acting as a light scatter and appearing white, or any other color, or opaque when the light emitter is inactive. When the light emitter is energized or active, the light transmission control material transitions, losing its light scattering properties, becoming clear or less-light scattering to light from the LED and allowing the transfer of this light.

The present invention is described herein with reference to certain embodiments but it is understood that the invention can be embodied in many different forms and should not be construed as limited to the embodiments set forth herein. In particular, the present invention is described below in regards to coating LEDs, light emitters, and lamps with a light transmission control coating that is typically comprised of a polymer, but it is understood that the present invention can be used to coat LEDs with other materials for light transmission control. It is also understood that the light transmission control can be combined with materials which have scattering or light extraction particles or materials, and that the coating can be electrically or thermally active. The light transmission control coatings or materials can be directly on the LEDs or can be part of or form structures remote to the LEDs. Remote light transmission control or materials, can be provided in many different shapes including but not limited to planar, dome, glove, bullet, square or other multiple planar shapes, etc. For the remote embodiments, the light transmission control coating or materials can comprise one or more layers on the inside and/or outside of the remote structure or can be mixed in or internal to the remote structure. In other embodiments, the light transmission control coating or materials can be provided in a binder material, such as an epoxies, glass, silicones, plastics, etc.

The methods according to the present invention can also be used for coating other semiconductor devices with different materials. Additionally, single or multiple coatings and/or layers can be formed on the LEDs. A coating can include polymers, scattering particles, and/or other materials. With multiple coatings and/or layers, each one can include different materials, different particles, different optical properties, such as transparency, index of refraction, and/or different physical properties, as compared to other layers and/or coatings.

It is also understood that when an element such as a layer, region or substrate is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of idealized embodiments of the invention. As such, variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

The present invention can be used in conjunction with many different solid state emitters, with the embodiment of the invention below being described in relation to an LED. It is understood that the present invention can also be used in other solid state emitter packages beyond the embodiment shows, from simple "metal cup" packages known in the art, to more complex packages. The present invention can also be used with multiple emitter packages, such as LED packages having more than one LED. The present invention can also be used with all types of LEDs, not just the types discussed herein. The discussion of the present invention with reference to the following embodiment should not be construed as limiting to that particular embodiment or similar embodiments.

In some embodiments the light transmission control material can be triggered by heat, acting as a thermally reversible light scattering material. Upon heating the light transmission control material can change from a light scattering material to a less or non-light scattering material when hot. When the light transmission control material is less hot or at lower temperatures it can transition back to a light scattering material. The light transmission control material can be light scattering transitioning to less or non-light scattering for all wavelengths of light or for specific wavelengths of light such as those outputted by the light emitter. This light transmission control material could be in the form of a polymer, photochromic material, polychromic material, or other suitable material. Examples of materials can include polymer dispersed liquid crystal, polymer stabilized cholesteric texture, and suspended particle mediums. The light transmission control material can be applied by spin coating, printing, jet printing, screen printing, glass blown, thermal evaporation, gas coating, CFL, and other methods known in the art.

Polymer dispersed liquid crystal, (PDLC), technologies generally involve liquid crystal droplets either physically dispersed in a polymer matrix, or liquid crystal droplets formed by phase separation during curing of a reactive monomer/liquid crystal solution and/or by solvent removal. Droplet formation in the later case is due to decreased solubility of the liquid crystal material in the polymer being formed as compared to a higher solubility of the liquid crystal material in the monomer prior to curing. Droplet formation may also be due to the polymer and the liquid crystal both being soluble in a solvent whereas the liquid crystal is insoluble or immiscible in the polymer and forms droplets within the polymer as the solvent is removed.

In general with PDLC materials, the droplets of liquid crystal are responsible for the unique behavior of the material, the index of refraction of the liquid crystal droplets is different from the polymer matrix material and a layer of the droplet containing material is light scattering and thus appears translucent, frosted or white. When a layer of PDLC is provided between two transparent electrode layers, a voltage can be applied to change the index of refraction of the liquid crystal droplets. As the index of refraction of the droplets approaches that of the polymer matrix the PDLC layer decreases in light scattering and with a high enough applied voltage the PDLC materials can become transparent. Thus, these devices are electrically operated or electrooptic variable light scattering devices, though thermally induced changes from light scattering to clear are also possible for these materials. Dyes may also be added to the material. When a dye is used, the dye will preferably be substantially separated into the liquid crystal phase resulting in the light modulating material normally having a colored opaque appearance, which can be changed to a transparent or clear appearance by application of an electrical potential or temperature change.

Suspended particle devices (SPDs), generally involve a thin film laminate of rod-like particles suspended in a fluid which is attached to one layer or placed between two layers of glass or plastic. When no voltage is applied, the suspended particles are arranged in random orientations and tend to absorb light, so that the glass panel looks dark (or opaque), blue or grey or black color. When voltage is applied, the suspended particles align and let light pass. SPDs can be dimmed, and allow instant control of the amount of light and heat passing through. A small but constant electrical current is required for keeping the SPD smart window in its transparent stage.

Polymer stabilized cholesteric texture, (PSCT), technologies generally involve a cholesteric liquid crystal being mixed with a small amount of a reactive monomer, and placing this in a very thin film between conducting layers. The monomer is then allowed to react while an applied electric field holds the liquid crystal material in a clear or low light scattering state known as the homeotropic texture. Thus, the small amount of polymer matrix formed during the curing process favors or stabilizes this texture to some extent and the liquid crystal returns to it in the future when voltages of adequate strength are applied across the liquid crystal layer. In the absence of an applied voltage the liquid crystal material goes to a light scattering, focal conic texture. Devices with this technology rapidly switch between light scattering with no applied voltage to fairly low light scattering with an applied voltage. Reverse mode devices are also possible in which there is relatively little light scattering in the no voltage applied condition and the device becomes light scattering when a voltage is applied. PSCT technology lends itself to thermally reversible light scattering as heating a PSCT material from its mesomorphic phase with focal conic texture to it isotropic phase causes the polymer stabilized material to change from light scattering to less light scattering or clear.

The source of heat which triggers the change in light scattering properties may be an electric power source with a resistive element which heats a transparent or non-transparent conductive material in thermal contact with the light transmission control material. Examples include conventional strip heaters, wire heating coils, a thin metal foil or a metal film on a substrate and transparent heaters like a layer of tin doped indium oxide, (ITO), or fluorine doped tin oxide on a flexible or a rigid substrate. Other resistive heaters, that allow for light transmission, can be associated with or even embedded in the light transmission control material and include an array of fine wires, a fine wire mesh and a metal grid pattern formed by additive or subtractive processes. Considering that light transmission efficiency is important in the use of light emitters, it may be advantageous to use a heating method which would be transparent to allow the maximum amount of light to exit the device without being interrupted by devices such as reflective wiring. The source of heat may also be a source of electromagnetic radiation such as ultraviolet, visible, infrared or microwave radiation in radiative contact with the devices of the invention. For example, the light emitter itself could be the source of heat which would cause the light transmission control material to transition into its less or non-light scattering form. The temperatures at which the light transmission control material transitions from light scattering to less or non-light scattering are alterable and can be adjusted to meet different light applications to account for differences in variables such as the environment or special use lighting applications.

In other embodiments the light transmission control material can be triggered by electricity, acting as an electrically reversible light scattering material. In the absence of an applied electrical field, the particles in the light transmission control material, for example a liquid suspension or plastic film, assume random positions and act as a light scatterer. However, when an electric field is applied through the light transmission control material, the particles become aligned and become less or non-light scattering. The light transmission control material is thus relatively transparent in the active or on state. These light transmission control materials when triggered to be less or non-light scattering would preferably cause no more than 20% emission loss and in other embodiments no more than 10% emission loss. In still other embodiments they would cause no more than 4% emission loss, or allow at least 96% of light emissions.

Figure 3C:
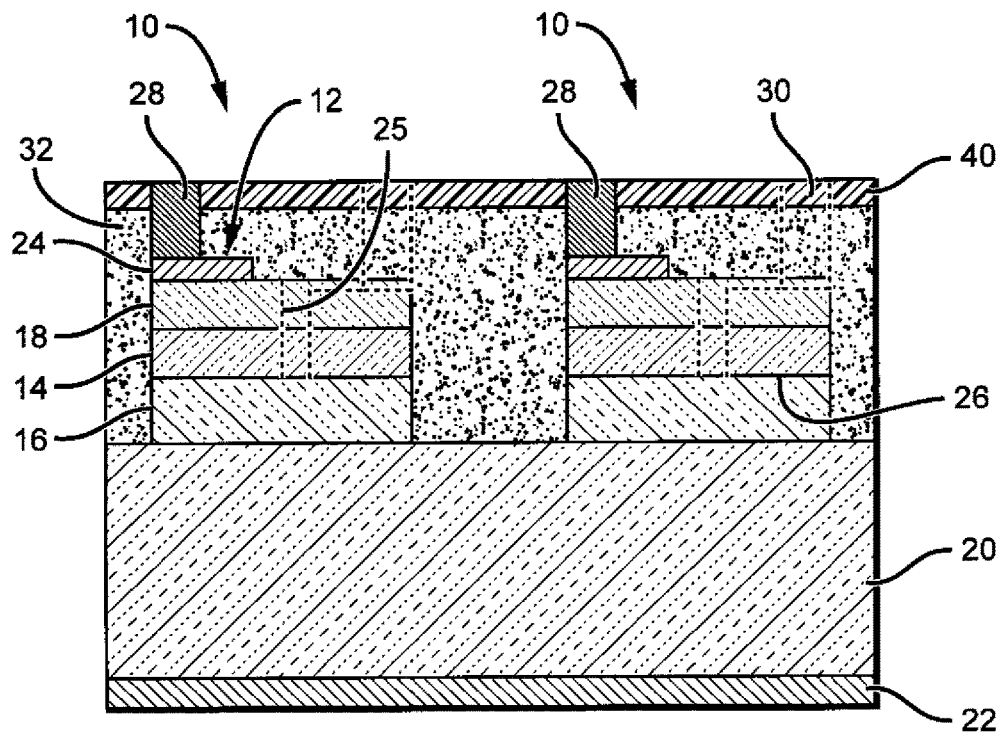
FIG. 3c is a sectional view of one embodiment of an LED chip wafer at fabrication steps according to the present invention.

FIGS. 3a, 3b, and 3c show one embodiment of wafer level LED chip 10 according to the present invention. The LED chips 10 are shown at a wafer level of their fabrication process. That is, the LEDs chips 10 have not been through all the steps necessary before being separated/singulated from wafer into individual LED chips. Phantom lines are included to show separation or a dicing line between the LED chips 10 and following additional fabrication steps, and the LED chips can be separated into individual devices. Commonly assigned and co-pending patent application Ser. No. 11/656,759 to Chtinis et al., entitled "Wafer Level Phosphor Coating Method and Devices Fabricated Utilizing Method," discusses wafer level device fabrication and coating methods, including flip-chip devices. The contents of which are incorporated entirely herein by reference. FIG. 3a also shows only two devices at the wafer level, but it is understood that many more LED chips can be formed from a single wafer. For example, when fabricating LED chips having a 1 millimeter (mm) square size, up to 4500 LED chips can be fabricated on a 3 inch wafer.

Each of the LED chips 10 comprises a semiconductor LED 12 that can have many different semiconductor layers arranged in different ways. The fabrication and operation of LEDs is generally known in the art and only briefly discussed herein. The layers of the LED 10 can be fabricated using known processes with a suitable process being fabrication using metal organic chemical vapor deposition (MOCVD). The layers of the LEDs generally comprise an active layer/region 14 sandwiched between first and second oppositely doped epitaxial layers 16, 18, all of which are formed successively on a substrate 20. In this embodiment the LEDs 12 are shown as separate devices on the substrate 20. This separation can be achieved by having portions of the active region 14 and doped layers 16, 18 etched down to the substrate 20 to form the open areas between the LEDs 12. In other embodiments, the active layer 14 and doped layers 16, 18 can remain continuous layers on the substrate 20 and can be separated into individual devices when the LED chips are singulated.

It is understood that additional layers and elements can also be included in the LED 12, including but not limited to buffer, nucleation, contact and current spreading layers as well as light extraction layers and elements. The active region 14 can comprise single quantum well (SQW), multiple quantum well (MQW), double heterostructure or super lattice structures. In one embodiment, the first epitaxial layer 16 is an n-type doped layer and the second epitaxial layer 18 is a p-type doped layer, although in other embodiments the first layer 16 can be p-type doped and the second layer 18 n-type doped. The first and second epitaxial layers 16, 18 are hereinafter referred to as n-type and p-type layers, respectively.

The region 14 and layers 16, 18 of the LEDs 12 may be fabricated from different material systems, with preferred material systems being Group-III nitride based material systems. Group-III nitrides refer to those semiconductor compounds formed between nitrogen and the elements in the Group III of the periodic table, usually aluminum (Al), gallium (Ga), and indium (In). The term also refers to ternary and quaternary compounds such as aluminum gallium nitride (AlGaN) and aluminum indium gallium nitride (AlInGaN). In a preferred embodiment, the n- and p-type layers 16, 18 are gallium nitride (GaN) and the active region 14 is InGaN. In alternative embodiments the n- and p-type layers 16, 18 may be AlGaN, aluminum gallium arsenide (AlGaAs) or aluminum gallium indium arsenide phosphide (AlGaInAsP).

The substrate 20 can be made of many materials such as sapphire, silicon carbide, aluminum nitride (AlN), GaN, with a suitable substrate being a 4H polytype of silicon carbide, although other silicon carbide polytypes can also be used including 3C, 6H and 15R polytypes. Silicon carbide has certain advantages, such as a closer crystal lattice match to Group III nitrides than sapphire and results in Group III nitride films of higher quality. Silicon carbide also has a very high thermal conductivity so that the total output power of Group-III nitride devices on silicon carbide is not limited by the thermal dissipation of the substrate (as may be the case with some devices formed on sapphire). SiC substrates are available from Cree Research, Inc., of Durham, N.C. and methods for producing them are set forth in the scientific literature as well as in a U.S. Pat. Nos. Re. 34,861; 4,946,547; and 5,200,022. In the embodiment shown, the substrate 20 is at the wafer level, with the plurality of LEDs 12 formed on the wafer substrate 20.

Each of the LEDs 12 can have first and second contacts 22, 24. In the embodiment shown, the LEDs have a vertical geometry with the first contact 22 on the substrate 20 and the second contact 24 on the p-type layer 18. The first contact 22 is shown as one layer on the substrate, but when the LED chips are singulated from the wafer the first contact 22 will also be separated such that each LED chip 10 has its own portion of the first contact 22. An electrical signal applied to the first contact 22 spreads into the n-type layer 16 and a signal applied to the second contact 24 spreads into the p-type layer 18. In the case of Group-III nitride devices, it is well known that a thin semitransparent current spreading layer typically covers some or all of the p-type layer 18. It is understood that the second contact 24 can include such a layer which is typically a metal such as platinum (Pt) or a transparent conductive oxide such as indium tin oxide (ITO). The first and second contacts 22, 24 are hereinafter referred to as the n-type and p-type contacts respectively.

The present invention can also be used with LEDs having lateral geometry wherein both contacts are on the top of the LEDs. A portion of the p-type layer 18 and active region is removed, such as by etching to expose a contact mesa on the n-type layer 16. The boundary of the removed portion of the active region 14 and p-type layer 18 is designated by vertical phantom line 25. A second lateral n-type contact 26 (also shown in phantom) is provided on the mesa of the n-type layer 16. The contacts can comprise known materials deposited using known deposition techniques.

According to the present invention, a p-type contact pedestal 28 is formed on the p-type contact 24 that is utilized to make electrical contact to the p-type contact 24 after coating of the LEDs 12. The pedestal 28 can be formed of many different electrically conductive materials and can be formed using many different known physical or chemical deposition processes such as electroplating, electroless plating, or stud bumping, with the preferred contact pedestal being gold (Au) and formed using stud bumping. This method is typically the easiest and most cost effective approach. The pedestal 28 can be made of other conductive materials beyond Au, such as copper (Cu) or nickel (Ni) or Indium, or combinations thereof.

The process of forming stud bumps is generally known and only discussed briefly herein. Stud bumps are placed on the contacts (bond pads) through a modification of the "ball bonding" process used in conventional wire bonding. In ball bonding, the tip of the bond wire is melted to form a sphere. The wire bonding tool presses this sphere against the contact, applying mechanical force, heat, and/or ultrasonic energy to create a metallic connection. The wire bonding tool next extends the gold wire to the connection pad on the board, substrate, or lead frame, and makes a "stitch" bond to that pad, and finishes by breaking off the bond wire to begin another cycle. For stud bumping, the first ball bond is made as described, but the wire is then broken close above the ball. The resulting gold ball, or "stud bump" remains on the contact and provides a permanent, reliable connection through to the underlying contact metal. The stud bumps can then be flattened (or "coined") by mechanical pressure to provide a flatter top surface and more uniform bump heights, while at the same time pressing any remaining wire into the ball.

The height of the pedestal 28 can vary depending on the desired thickness of the phosphor coating and light transmission control coating 40 and should be high enough to match or extend above the top surface of at least one of these coatings from the LED. The height can exceed 200 μm, with typical pedestal height in the range of 20 to 60 μm. In some embodiments, more than one stud bump can be stacked to achieve the desired pedestal height. The stud bumps or other forms of the pedestal 28 can also have a reflecting layer or can be made of a reflective material to minimize optical losses.

For the vertical geometry type LEDs 12 shown, only one pedestal 28 is needed for the p-type contact 24. For alternative lateral geometry LEDs a second n-type pedestal 30 (shown in phantom) is formed on the lateral geometry n-type contact 26, typically of the same materials, to substantially the same height as the p-type pedestal 28, and formed using the same processes.

In FIG. 3a the wafer is blanketed by a phosphor coating 32 that covers each of the LEDs 12, and its contact 22, and has a thickness such that it covers/buries the pedestal 28. For lateral geometry devices, the contact 26 and pedestal 30 are also buried. The present invention provides the advantage of depositing the phosphor coating over the LEDs 12 at the wafer level without the need for alignment over particular devices or features. Instead, the entire wafer is covered, which provides for a simpler and more cost effective fabrication process. The phosphor coating can be applied using different processes such as spin coating, electrophoretic deposition, electrostatic deposition, printing, jet printing or screen printing. In the embodiment of FIG. 3a the light transmission control coating 40 can be applied after the pedestals are exposed by thinning the phosphor coating, as described below. Alternately, as in FIGS. 3b and 3c, the light transmission control coating 40 can be applied over the phosphor coating beginning at a level below the top of the pedestal 28 and extending over and covering/burying the pedestal 28 (FIG. 3b) to be thinned by processes described below (FIG. 3c). The phosphor can be deposited, cured, and thinned using a variety of methods such as those described in U.S. patent application Ser. No. 11/656,759.

In a preferred embodiment, the light transmission control coating 40 can be deposited over the wafer in a light transmission control mixture using spin coating or other suitable coating method known in the art. Spin coating is generally known in the art and generally comprises depositing the desired amount of light transmission control mixture at the center of the substrate and spinning the substrate at high speed. The centrifugal acceleration causes the mixture to spread to and eventually off the edge of the substrate.

Final layer thickness and other properties depend on the nature of the mixture (viscosity, drying rate, surface tension, etc.) and the parameters chosen for the spin process. For large wafers it may be useful to dispense the light transmission control mixture over the substrate before spinning the substrate at high speed.

The light transmission control coating 40 can then be cured using many different curing methods depending on different factors such as the type of light transmission control used. Different curing methods include but are not limited to heat, ultraviolet (UV), infrared (IR) or air curing. The light transmission control coating 40 can also have different concentrations of light transmission control materials.

As discussed above, the pedestal 28 (and pedestal for lateral devices) may be buried by either the phosphor coating 32 (FIG. 3a) or partially by the phosphor coating 32 and then by the light transmission control coating 40 (FIGS. 3b and 3c), which allows for the LED chips 10 to be coated without the need for alignment. After the initial coating of the LED chips, further processing is needed to expose the pedestal 28.

In the embodiment shown in FIG. 3a the phosphor coating which has buried the pedestals is thinned or planarized so that the pedestals 28 are exposed through the coating's top surface. Many different thinning processes can be used including known mechanical processes such as grinding, lapping or polishing, preferably after the binder has cured. Other fabrication methods can comprise a squeegee to thin the coating before cured or pressure planarization can also be used before the coating is cured. Still in other embodiments the coating can be thinned using physical or chemical etching, or ablation. The thinning process not only exposes the pedestals, but also allows for planarizing of the coating and for control of the final thickness of the coating. After this thinning, the light transmission control coating 40 is applied to at least a portion of the top layer of the wafer to cover the phosphor areas. The light transmission control coating 40 would need to be aligned to leave open access to the pedestals or a removal process would be required to open access to the pedestals. The light transmission control coating may be made of a variety of materials including those discussed earlier.

In the embodiment shown in FIGS. 3b and 3c the light transmission control coating 40 which has buried the pedestals in FIG. 3b is thinned or planarized so that the pedestals 28 are exposed through the coating's top surface, as shown in FIG. 3c. Many different thinning processes can be used including known mechanical processes such as grinding, lapping or polishing, preferably after the binder has cured. Other fabrication methods can comprise a squeegee to thin the coating before cured or pressure planarization can also be used before the coating is cured. Still in other embodiments the coating can be thinned using physical or chemical etching, or ablation. The thinning process not only exposes the pedestals, but also allows for planarizing of the coating and for control of the final thickness of the coating.

In some embodiments the surface can be textured during planarization. In other embodiments, after planarization the coating or other surfaces, can be textured such as by laser texturing, mechanical shaping, etching (chemical or plasma), or other processes, to enhance light extraction. Texturing results in surface features that are 0.1-5 μm tall or deep, and preferably 0.2-1 μm. In other embodiments, the surface of the LEDs 12 can also be textured or shaped for improved light extraction.

The individual LED chips 10 can be singulated from the wafer using known methods such as dicing, scribe and breaking, or etching. The singulating process separates each of the LED chips 10 with each having substantially the same thickness of coating 32 and 40, and as a result, substantially the same amount of phosphor, emission, and light transmission control characteristics. This allows for reliable and consistent fabrication of LED chips 10 having similar emission characteristics. Following singulating the LED chips can be mounted in a package, or to a submount or printed circuit board (PCB) without the need for further processing to add phosphor or light transmission control material. In one embodiment the package/submount/PCB can have conventional package leads with the pedestals electrically connected to the leads. A conventional encapsulation can then surround the LED chip and electrical connections. In another embodiment, the LED chip can be enclosed by a hermetically sealed cover with an inert atmosphere surrounding the LED chip at or below atmospheric pressure. The light transmission control material can also be added as a coating after the encapsulant or enclosure has been placed over the LED chip.

For the LED chips 10, light from the LED 12 that is emitted toward substrate 20 can pass out of the LED chip 10 through the substrate without passing through the phosphor coating 32. This can be acceptable for generating certain colors or hues of light. In embodiments where this substrate emission is to be prevented or minimized, the substrate 20 can be opaque so that light from the LED 12 emitted toward the substrate 20 is blocked or absorbed so that most light emitting from the LED chip 10 comes from light passing through the coating 32.

In another embodiment, as shown in FIG. 4, the light transmission control coating can also be applied on devices which are flip-chip mounted. FIG. 4 shows another embodiment of LED chips 400 having LEDs 402 having an active region 405 between n- and p-type layers 406, 408, on a growth substrate 404. It is understood that the LEDs 402 can also be provided with the growth substrate thinned or after the growth substrate has been removed. The LEDs also have n-type and p-type contacts 407, 409. The LEDs 402 are diced or singulated and flip-chip bonded to a submount/carrier wafer 410. Conductive traces 412 are formed on the submount/carrier wafer 410 with each of the LEDs 402 mounted on the traces 412, with the first trace 412a in electrical contact with the n-type layer 406 and the second trace 412b in contact with the p-type layer 408. Conventional traces can be used comprising aluminum (Al) or Au deposited using known techniques such as sputtering. The LED 402 is mounted to the traces 412 by flip-chip bonds 413 that can be arranged in conventional ways using known materials such as Au, or gold/tin solder bumps or stud bumps. The chip in FIG. 4 can structured and fabricated as described in application Ser. No. 11/656,759, which has been incorporated entirely herein by reference.

An n-type pedestal 414 is formed on the first trace 412a and a p-type pedestal 416 is formed on the second trace 412b, with both pedestals being formed using the methods described above. A phosphor/binder coating 418 is included over the LEDs 402, burying the pedestals 414, 416. The coating 418 can then be planarized to expose the pedestals 414, 416 for contacting, or in other embodiments the recesses can be formed in the coating to expose the pedestals 414, 416. The LED chips can then be singulated using the processes described above. Before or after singulation the LED chips can be coated by a light transmission material coating 40 as described above. In addition a light transmission control triggering structure can be added if desired, such as resistive heating elements or electrically coupling the light transmission material coating 40 to the LED chip.

In the embodiments shown in FIGS. 3*a,* 3*b,* 3*c,* and 4, the light transmission control coating 40 works to mask the appearance of the LED when the emitter is inactive, by appearing opaque, white, or any other suitable color. The light transmission control coating 40 becomes transparent to at least the light of the LED, or any other desired wavelength, when the LED is active or energized. The light transmission control coating 40 can be triggered to become transparent either thermally or electrically. Thermal triggering can be achieved from the heat of the LED itself, through thermal coupling, or the source of heat which triggers the change in light scattering properties may be an electric power source with a resistive element which heats a transparent or non-transparent conductive material in thermal contact with the light transmission control material. Examples include conventional strip heaters, wire heating coils, a thin metal foil or a metal film on a substrate and transparent heaters like a layer of tin doped indium oxide, (ITO), or fluorine doped tin oxide on a flexible or a rigid substrate, or other suitable materials. Electric triggering can be achieved by electrically coupling the light transmission control coating to the light and applying an electric field through the light transmission control material, causing the particles in the light transmission control coating 40 to become aligned and become less or non-light scattering.

It is understood that the light transmission control coatings according to the present invention can be triggered from one state (e.g. opaque, white or other color) to another state (e.g. light transmitting) in response to many different stimuli beyond those described in the present application. For example, in some embodiments the change in state can occur optically, such as in response to certain wavelengths of light. In some embodiments this can include light from the LED light source, while in other embodiments it can include light from a remote light source. For embodiments where the material is responsive to light from the LED light source, the material can be opaque or white when the LED is not transmitting light and then can change state to light transmitting when the LED is emitting light. In still other embodiments, the change in state can be chemically triggered.

Figure 6B:
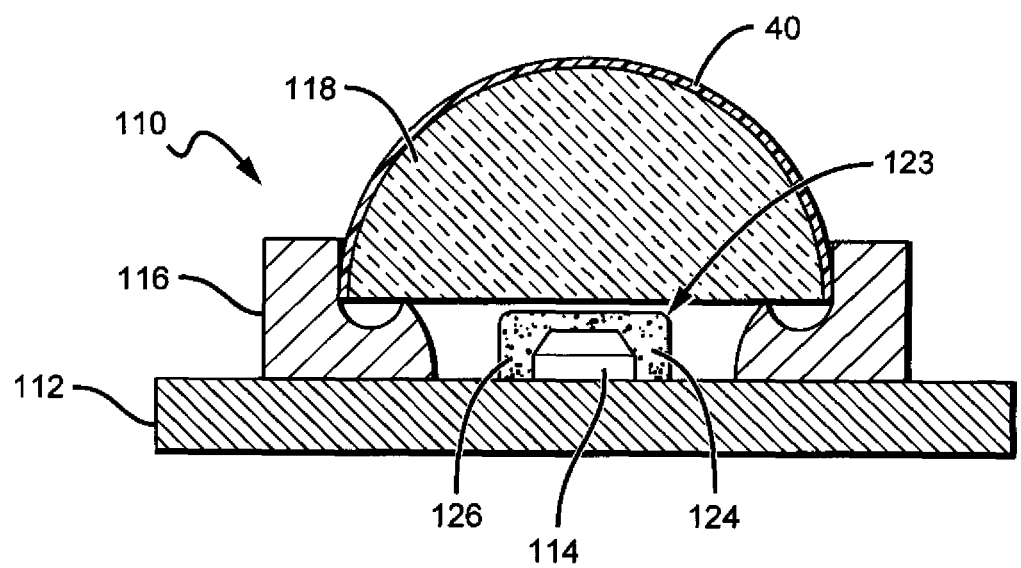
FIG. 6b is a sectional view of one embodiment of an LED package according to the present invention.

FIGS. 5, 6*a,* and 6*b* show one embodiment of an LED package 110 according to the present invention. Commonly assigned and co-pending patent application Ser. No. 11/974,431 to Keller et al., entitled "Multiple Conversion Material Light Emitting Diode Package and Method of Fabricating Same," discusses LED packages and fabrication methods. The contents of which are incorporated entirely herein by reference. The LED package 110 generally comprises a substrate/submount ("submount") 112, an LED 114 mounted on the substrate 112 and a reflector cup assembly ("reflector cup") 116 also mounted on the submount 112. Primary optics, such as a lens 118 can be placed over the LED 114, such as on the reflector cup 116 and bonded to the package using different mounting methods such that light from the LED 114 passes through the lens 118. For example, the space between the bottom of the lens 118 and the remainder of the package 110 can be filled with an encapsulating material such as a silicone polymer (not shown) with the bottom of the lens 118 in contact with the gel. The package 110 can then be heat cured, which causes the encapsulating material to solidify and adhere to the lens 118, bonding the lens 118 in place over the LED 114 and reflector cup 116. Many different lenses and encapsulating materials can be used in the packages according to the present invention to provide different output characteristics. Furthermore, lenses of various materials can also be mounted directly to the substrate without the reflector. Alternatively, lenses can be entirely omitted for other package embodiments.

The LED 114 can have many different semiconductor layers arranged in different ways as discussed above. It is also understood that additional layers and elements can also be included in the LED 114. The submount 112 may be formed in many different shapes and sizes and of many different materials with a preferred material being electrically insulating. Suitable materials include, but are not limited to ceramic materials such as aluminum oxide or aluminum nitride. Alternative substrate configurations could use electrically conductive metal lead frame assemblies that are bonded with thermoset or thermoplastic resin materials. The reflector cup 116 should be formed of durable, high melting temperature material that can withstand subsequent packaging manufacturing steps and the heat generated by the package during operation. Many different materials can be used, such as high melting temperature material including plastics, such as Novella resin, or liquid crystal polymers. The submount has a top surface comprising electrical traces 120 and a mounting pad (not shown), with LED 114 mounted to the mounting pad and the electrical traces 120 providing a conductive path for electrical connection to the LED 114 using known contacting methods.

In the embodiment shown, the conversion material 123 is shown covering the LED 114 and comprises a first phosphor material 124 and a second phosphor material 126 dispersed evenly over the LED 114. It should be noted that any number of phosphors can be used for the purpose of the present invention. The second phosphor 126 is shown dark for illustrative purposes to distinguish from the first phosphor 124. The first and second phosphors 124, 126 can also be included in other areas of the package 110, including but not limited to the encapsulating material or the lens 118. The phosphors 124, 126 are shown with even distribution over the LED 114 although in other embodiments the phosphor 124, 126 can be segregated to a particular area and can have different concentrations over the LED 114. The phosphors 124, 126 are typically held on the LED by binder such as a silicone or epoxy.

In some embodiments the light transmission control coating 40 can be applied on the encapsulant. In other embodiments the light transmission control coating 40 can be applied on the lens 118. In other embodiments the light transmission control material can be included in the encapsulation material itself. In other embodiments the light transmission control material can be included in yet another layer or encapsulant which is placed over the package using compression molding or other known method. In embodiments according to the present invention the light transmission control material is placed on or outside of the areas which are intended to be hidden when the light emitter is inactive or not energized. The light transmission control material coatings can be applied using multiple thin film coatings, one thick bulk coating, or any other suitable known method.

Different embodiments of the present invention can include a lamp or bulb structure comprising a remote conversion material with a light transmission control material over the conversion material areas or the lamp or bulb structure itself. Embodiments can include lamp structures comprising a light transmission control layer that not only serves to mask the phosphor from the view by the lamp user, but if desired can also disperse or redistribute the light from the remote phosphor and/or the lamp's light source into a desired emission pattern. As further described below, the lamps according to the present invention can be arranged in many different ways. In some embodiments the light sources can comprise solid state light sources, such as different types of LEDs, LED chips or LED packages. In some embodiments a single LED chip or package can be used, while in others multiple LED chips or packages can be used arranged in different types of arrays. The LED packages can comprise LEDs which are encapsulated or unencapsulated.

Figure 7:
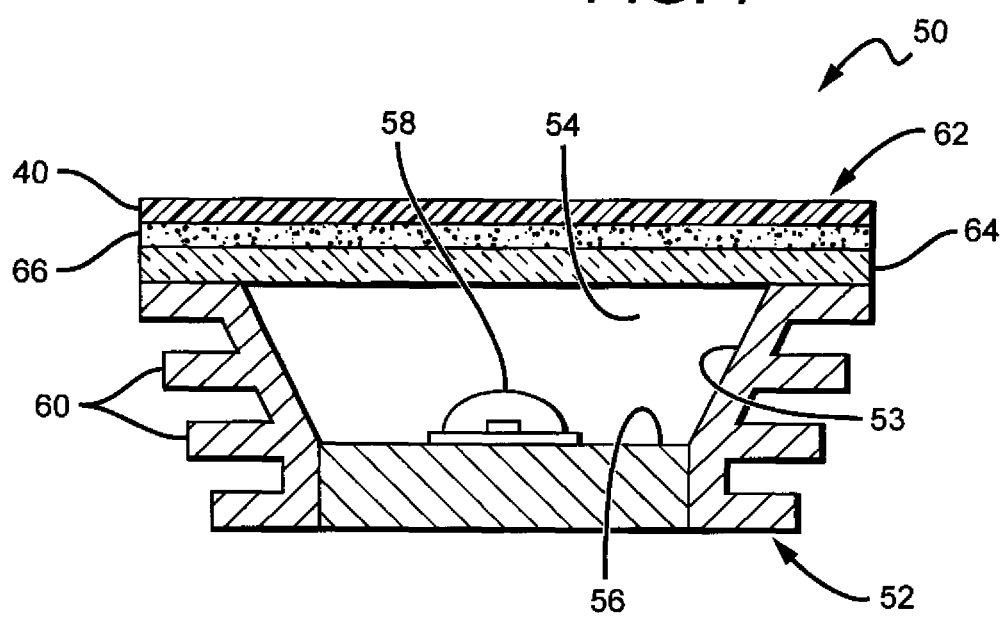
FIG. 7 is a sectional view of one embodiment of a lamp according to the present invention.

One embodiment of an LED based lamp according to the present invention comprises an LED light source and a phosphor arranged remote to the light source. Light emitted from the light source passes through the phosphor and at least some of the light is converted by the phosphor. FIG. 7 shows one embodiment of an LED lamp 50 according to the present invention. This embodiment comprises a heat sink structure 52 having an optical cavity 54 with a platform 56 for holding a light source 58. The light source 58 can comprise many different emitters with the embodiment shown comprising an LED or LED chip. Many different commercially available LED chips or LED packages can be used including but not limited to those LEDs and LED packages commercially available from Cree, Inc. located in Durham, N.C. The light source 58 can be mounted to the platform 56 using many different known mounting methods and materials with light from the light source 58 emitting out the top opening of the cavity 54. In some embodiments light source 58 can be mounted directly to the platform 56, while in other embodiments the light source can be included on a submount or printed circuit board (PCB) that is then mounted to the platform 56. The platform 56 and the heat sink structure 52 can comprise electrically conductive paths for applying an electrical signal to the light source 58, with some of the conductive paths being conductive traces or wires. All or portions of the platform 56 can also be made of a thermally conductive material and the thermally conductive material can be thermally coupled to or integral to the heat sink structure 52.

The heat sink structure 52 can at least partially comprise a thermally conductive material, and many different thermally conductive materials can be used including different metals such as copper or aluminum, or metal alloys such as brass. The heat sink structure 52 can also comprise other heat dissipation features such as heat fins 60 that increase the surface area of the heat sink facilitate more efficient dissipation into the ambient. Reflective layers 53 can also be included on the heat sink structure 52, such as on the surface of the of optical cavity 54. In some embodiments the surfaces can be coated with a material having a reflectivity of approximately 75% or more to the lamp light, while in other embodiments the material can have a reflectivity of approximately 85% or more to the lamp light. In still other embodiments the material can have a reflectivity to the lamp light of approximately 95% or more.

The heat sink structure 52 can also comprise features for connecting to a source of electricity such as to different electrical receptacles. In some embodiments the heat sink structure can comprise a feature of the type to fit in conventional electrical receptacles. For example, it can include a feature for mounting to a standard Edison socket, which can comprise a screw-threaded portion which can be screwed into an Edison socket. In other embodiments, it can include a standard plug and the electrical receptacle can be a standard outlet, or can comprise a GU24 base unit, or it can be a clip and the electrical receptacle can be a receptacle which receives and retains the clip (e.g., as used in many fluorescent lights). These are only a few of the options for heat sink structures and receptacles, and other arrangements can also used that safely deliver electricity from the receptacle to the lamp 50.

A phosphor carrier window 62 is included over the top opening of the cavity 54 and in the embodiment shown it covers the entire opening. In other embodiments multiple phosphor carrier windows may be used. Other embodiments of the phosphor carrier window can also comprise features to enhance light extraction from the lamp. In the embodiment shown, the cavity opening is circular and the phosphor carrier window 62 is a circular disk but it is understood that the cavity opening and the phosphor carrier window can be many different shapes and sizes. It is also understood that the phosphor carrier window 62 can cover less than the entire cavity opening.

The carrier windows according to the present invention are characterized as comprising a conversion material and thermally conductive light transmitting material. The light transmitting material should be transparent to the light emitted from the light source 54 and the conversion material should be of the type that absorbs the wavelength of light from the light source and re-emits a different wavelength of light. In the embodiment shown, the thermally conductive light transmitting material comprises a carrier layer 64 and the conversion material comprises a phosphor layer 66 on the carrier window. As further described below, different embodiments can comprise many different arrangements of the thermally conductive light transmitting material and the conversion material. The light transmitting material can be in the form a layer on one or both sides of the window 62, such as in a binder, or the material can be integral (i.e. mixed in) the window 62.

The carrier layer 64 can be made of many different materials such as quartz, silicon carbide (SiC) (thermal conductivity ~10 W/m-k), glass (thermal conductivity of 1.2-1.4 W/m-k) or sapphire (thermal conductivity of ~40 W/m-k). The carrier window can also have different thicknesses depending on the material being used, with a suitable range of thicknesses being 0.1 mm to 10 mm or more. It is understood that other thicknesses can also be used depending on the characteristics of the material for the carrier layer. The material should be thick enough to provide sufficient lateral heat spreading for the particular operating conditions. Generally, the higher the thermal conductivity of the material, the thinner the material can be in providing the necessary thermal dissipation. These materials can effectively spread heat laterally and as a result do not need the large area required by materials with lower thermal conductivity. Different factors can impact which carrier window material is used including but not limited to cost and transparency to the light source light. Some materials may also be more suitable for larger diameters, such as glass or quartz. These can provide reduced manufacturing costs by formation of the phosphor layer on the larger diameter carrier layers and then singulation into the smaller carrier layers.

In this embodiment a light transmission control coating 40 can be included over at least a part of the phosphor carrier window 62. The light transmission control coating 40 works to mask the appearance of the lamp and phosphor carrier when the emitter is inactive, by appearing opaque, white, or any other suitable color. The light transmission control coating 40 becomes transparent when the lamp is active or energized. The light transmission control coating 40 can be triggered to become transparent either thermally or electrically. Thermal triggering can be achieved from the heat of the lamp itself, through thermal coupling, or the source of heat which triggers the change in light scattering properties may be an electric power source with a resistive element which heats a transparent or non-transparent conductive material in thermal contact with the light transmission control material. This conductive material may be the material already included in the phosphor carrier or may additional material. Examples include conventional strip heaters, wire heating coils, a thin metal foil or a metal film on a substrate and transparent heaters like a layer of tin doped indium oxide, (ITO), or fluorine doped tin oxide on a flexible or a rigid substrate, or other suitable material. Electric triggering can be achieved by electrically coupling the light transmission control coating to the light and applying an electric field through the light transmission control material, causing the particles in the light transmission control coating 40 to become aligned and become less or non-light scattering.

Figure 8:
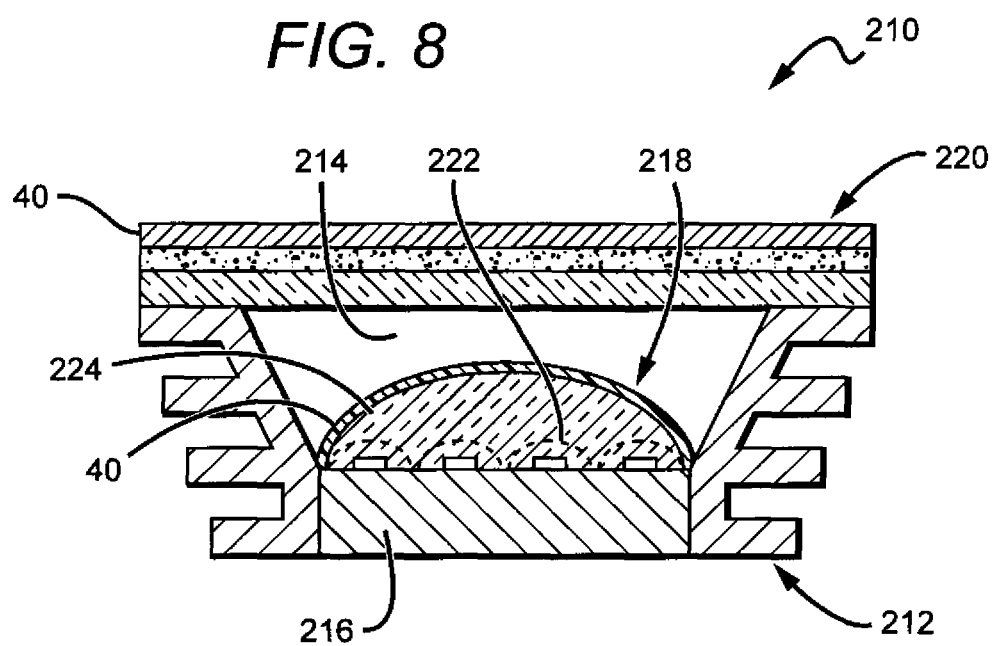
FIG. 8 is a sectional view of another embodiment of a lamp according to the present invention.

FIG. 8 shows another embodiment of a lamp 210 similar to the lamp 50 described above and shown in FIG. 7. The lamp 210 comprises a heat sink structure 212 having a cavity 214 with a platform 216 arranged to hold a light source 218. A phosphor carrier window 220 can be included over and at least partially covering the opening to the cavity 214. In this embodiment, the light source 218 can comprise a plurality of LEDs arranged in separate LED packages or arranged in an array in single multiple LED packages. For the embodiments comprising separate LED packages, each of the LEDs can comprise its own LED lens 222. In embodiments having a single multiple LED package, a single array lens 224 covering all the LEDs. It is understood that the LEDs can be provided without lenses and that in the array embodiments each of the LEDs can have its own lens. Like the lamp 50, the heat sink structure and platform can be arranged with the necessary electrical traces or wires to provide an electrical signal to the light source 218. As in FIG. 7, this embodiment can include a light transmission control coating 40 over at least a part of the phosphor carrier window 220. The light transmission control coating can also be placed on or mixed into the LED lens 222 or single array lens 224, depending on which area is intended to be masked when the lamp is off or not energized.

Figure 9:
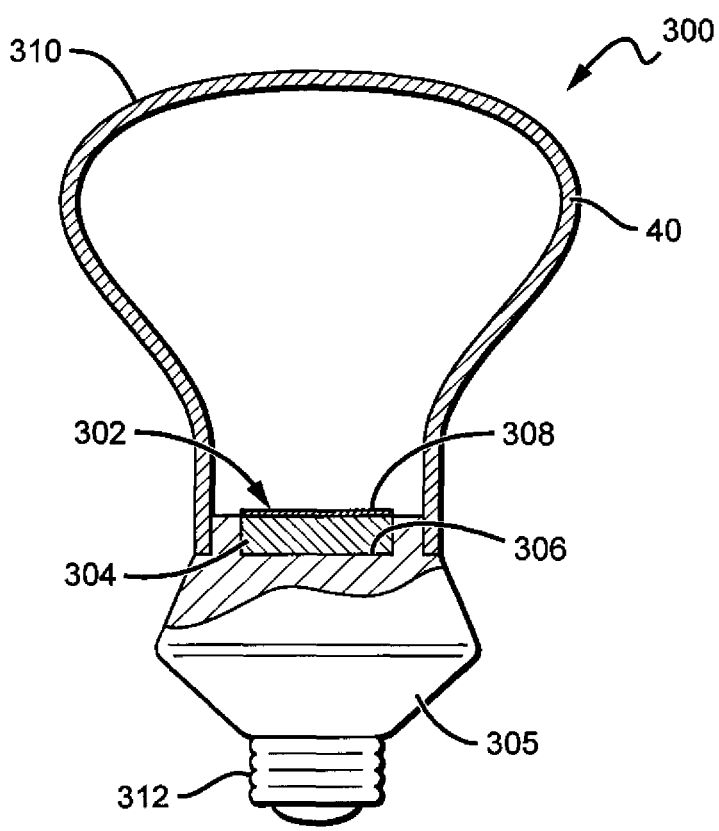
FIG. 9 is a sectional view of another embodiment of a lamp according to the present invention having a cover.

FIG. 9 shows still another embodiment of lamp 300 according to the present invention that comprises an optical cavity 302 within a heat sink structure 305. An LED based light source 304 is mounted to the platform 306, and a phosphor carrier window 308 is mounted to the top opening of the cavity 302, with the phosphor carrier window 308 having any of the features of those described above. The phosphor carrier window 308 may comprise a thermally conductive transparent material and a phosphor, and is mounted to the cavity with thermally conductive material or device as described above. The cavity 302 can have reflective surfaces to enhance the emission efficiency as described above. As in FIGS. 7 and 8, this embodiment can include a light transmission control coating 40 over at least a part of the phosphor carrier window 308. The light transmission control coating can also be placed on LED based light source 304 depending on which area is intended to be masked when the lamp is off or not energized.

Light from the light source 304 passes through the phosphor carrier window 308 where a portion of it is converted to a different wavelength of light by the phosphor in the phosphor carrier window 308. In one embodiment the light source 304 can comprise blue emitting LEDs and the phosphor carrier window 308 can comprise a yellow phosphor as described above that absorbs a portion of the blue light and re-emits yellow light. The lamp 300 emits a white light combination of LED light and yellow phosphor light. Like above, the light source 304 can also comprise many different LEDs emitting different colors of light and the phosphor carrier window can comprise other phosphors to generate light with the desired color temperature and rendering.

The lamp 300 also comprises a shaped cover 310 mounted over the cavity 302. In some embodiments this cover can be dome shaped, but it is understood that this cover can also be any other appropriate shape. In some embodiments this cover can be coated with a light transmission control material coating 40, preferably on the inside for protection of the coating material, or the cover itself may include light transmission control material within itself, provided in a curable binder that is formed in the general shape of the cover. In the embodiment shown, the cover 310 is mounted to the heat sink structure 305 and has an enlarged portion at the end opposite the heat sink structure 305. Different binder materials can be used as discussed above such as silicones, epoxies, glass, inorganic glass, dielectrics, BCB, polymides, polymers and hybrids thereof. The light transmission control material can have an opaque appearance or a white color that hides the light emitter structure and color of the phosphor in the phosphor carrier window 308 in the optical cavity when the light source is inactive or not energized. This gives the overall lamp 300, and cover 310, a white appearance that is generally more visually acceptable or appealing to consumers than the color of the phosphor. The light transmission control coating 40 becomes transparent when the lamp is active or energized. The light transmission control coating 40 or cover containing such can be triggered to become transparent either thermally or electrically. Thermal triggering can be achieved from the heat of the lamp itself, through thermal coupling, or the source of heat which triggers the change in light scattering properties may be an electric power source which resistively heats a transparent or non-transparent conductive material in thermal contact with the light transmission control material. This conductive material may be the material already included in the phosphor carrier, when the light transmission control coating is on the phosphor carrier, or may be additional conductive material. Examples of methods or materials which may be used to heat the light transmission control material regardless of where it is located include conventional strip heaters, wire heating coils, a thin metal foil or a metal film on a substrate and transparent heaters like a layer of tin doped indium oxide, (ITO), or fluorine doped tin oxide on a flexible or a rigid substrate. Electric triggering can be achieved by electrically coupling the light transmission control coating to the light and applying an electric field through the light transmission control material, causing the particles in the light transmission control coating 40 to become aligned and become less or non-light scattering.

The cover 310 can provide the added advantage of distributing the light emitting from the optical cavity in a more uniform special pattern. Light from the optical cavity can be emitted in a generally Lambertian pattern and the shape of the cover 310 can be coupled with added scattering particles causing light to emit from the cover in a more omnidirectional emission pattern. An engineered cover can have scattering particles in different concentrations in different regions or can be shaped to a specific emission pattern. In one embodiment the cover can be engineered so that the emission pattern complies with the Department of Energy (DOE) Energy Star defined omnidirectional distribution criteria. The lamp 300, along with the other lamp embodiments described herein can comprise A-type retrofit LED bulb that meets the DOE Energy Star standards and is simple and easy to manufacture. Different lamp embodiments according to the present invention can have many different shapes and sizes.

Like the embodiments above, the lamp 300 can comprise a mounting mechanism of the type to fit in conventional electrical receptacles. In the embodiment shown, the lamp 300 includes a screw-threaded portion 312 for mounting to a standard Edison socket. Like the embodiments above, the lamp 300 can include standard plug and the electrical receptacle can be a standard outlet, or can comprise a GU24 base unit, or it can be a clip and the electrical receptacle can be a receptacle which receives and retains the clip (e.g., as used in many fluorescent lights).

Although the present invention has been described in detail with reference to certain preferred configurations thereof, other versions are possible. Therefore, the spirit and scope of the invention should not be limited to the versions described above.

I claim:

1. A light emitting diode (LED) chip, comprising:
   an LED; and
   a phosphor layer over at least a portion of said LED;
   a light transmission control coating at least partially covering said LED, said light transmission control coating comprising a material configured to mask the appearance of said at least partially covered LED when said LED is inactive, wherein said material is configured to change to a non-masking state in response to an electrical signal applied to said light transmission control coating, said light transmission control coating planarized to expose at least one electrical connection of said LED, wherein said light transmission control coating is distinct from and at least partially covers said phosphor layer.

2. The LED chip of claim 1, wherein said light transmission control coating becomes less masking in response to an increase in temperature.

3. The LED chip of claim 2, wherein said light transmission control coating is thermally coupled to said LED chip.

4. The LED chip of claim 1, wherein said light transmission control coating is electrically coupled to said LED.

5. The LED chip of claim 1, wherein said light transmission control coating comprises a polymer.

6. The LED chip of claim 1, wherein said light transmission control coating causes less than 4% emission loss when said LED is active.

7. The LED chip of claim 1, wherein said light transmission control coating becomes less masking in response to an optical stimulus.

8. A light emitting diode (LED) package comprising:
   an LED chip;
   an optical cavity for holding said LED chip;
   package leads electrically connected to said LED chip;
   encapsulation comprising a lens portion surrounding said LED chip and electrical connections; and
   a light transmission control material over said LED chip and said lens portion, wherein said light transmission control material comprises a material configured to mask the appearance of said LED chip when said LED chip is inactive, and said material is configured to change from a masking state to a light transmitting state in response to an electrical signal applied to said material, wherein said optical cavity separates said light transmission control material from said LED chip and said encapsulation.

9. The LED package of claim 8, wherein said light transmission control material is included within a coating at least partially on said encapsulation.

10. The LED package of claim 8, wherein said light transmission control material is within said encapsulation.

11. The LED package of claim 8, wherein said light transmission control material is less masking when said LED chip is active.

12. The LED package of claim 11, wherein said light transmission control material causes at most 4% emission loss when said LED chip is active.

13. The LED package of claim 8, wherein said light transmission control material changes from masking to transmitting in response to increases in temperature.

14. The LED package of claim 13, wherein said light transmission control material is thermally coupled to said LED chip.

15. The LED package of claim 14, wherein said thermal coupling includes a conductive material in thermal contact with the light transmission control material.

16. The LED package of claim 15, wherein said conductive material is transparent.

17. The LED package of claim 8, wherein said light transmission control material is electrically coupled to said LED chip.

18. The LED package of claim 17, wherein said light transmission control material is electrically coupled to said LED chip using a transparent electrode.

19. The LED package of claim 8, wherein said light transmission control material changes from masking to light transmitting in response to light.

20. The LED package of claim 8, wherein said light transmission control material is applied to said encapsulation by molding.

21. A light emitting diode (LED) based lamp, comprising:
   an LED light source;
   encapsulation comprising a lens portion over and surrounding said LED light source;
   a phosphor remote to said LED light source such that light emitted from said LED light source passes through said phosphor and is converted by said phosphor, wherein an optical cavity separates said phosphor from said LED light source and said encapsulation; and
   a light transmission control material over said encapsulation, said LED light source and said phosphor, said light transmission control material comprising a material configured to mask the appearance of said LED light source and said phosphor when said LED is inactive and to transmit at least some light emitted from said LED and/or said phosphor in response to an electrical signal applied to said light transmission control material.

22. The LED based lamp of claim 21, wherein said light transmission control material comprises a coating at least partially on said phosphor.

23. The LED based lamp of claim 21, further comprising a cover over said LED light source and said phosphor.

24. The LED based lamp of claim 23, wherein said cover is coated with said light transmission control material.

25. The LED based lamp of claim 23, wherein said cover is comprised of said light transmission control material.

26. The LED package of claim 23, wherein said cover disperses light in a pre-determined pattern.

27. The LED based lamp of claim 21, wherein said light transmission control material is less masking when said LED light source is active.

28. The LED based lamp of claim 27, wherein said light transmission control material allows at least 96% of light emission when said LED light source is active.

29. The LED based lamp of claim 21, wherein said light transmission control material changes from masking to light transmitting in response to changes in temperature.

30. The LED based lamp of claim 29, wherein said light transmission control material is thermally coupled to said LED light source.

31. The LED based lamp of claim 21, wherein said light transmission control material is electrically coupled to said LED light source.

32. The LED package of claim 21, wherein said light transmission control material is applied to said encapsulation by compression molding.

33. The LED based lamp of claim 21, wherein said light transmission control material changes from masking to light transmitting in response to optical stimulus.

34. A light emitting device, comprising:
   a light emitting diode (LED); and
   a diffusing material at least partially covering said LED and comprising a light scattering ability which varies with temperature, wherein an optical cavity separates said diffusing material from said LED, wherein said diffusing material is configured such that its light scattering ability decreases as the temperature of said diffusing material increases and its light scattering ability increases as the temperature of said diffusing material decreases.

35. The device of claim 34, wherein said diffusing material's light scattering ability further varies with exposure to an electric field, wherein said diffusing material is configured such that its light scattering ability decreases as said diffusing material is exposed to an increasing electric field and its light scattering ability increases as said diffusing material is exposed to a decreasing electric field.

36. A light emitting device, comprising:
   a light emitting diode (LED);
   a heat sink structure comprising an optical cavity for holding said LED;
   a light transmission control material optically coupled to said LED, said light transmission control material configured to be light scattering and thereby mask the appearance of said LED when said LED is inactive and to change from light scattering to less light scattering in response to light from said LED, wherein said optical cavity separates said light transmission control material from said LED;
   a shaped cover coated with said light transmission control material mounted over said optical cavity; and
   a phosphor layer separate from said light transmission control material;
   said device forming a bulb.

* * * * *